United States Patent
Oku et al.

[11] Patent Number: 5,888,859
[45] Date of Patent: Mar. 30, 1999

[54] METHOD OF FABRICATING SEMICONDUCTOR DEVICE

[75] Inventors: Tomoki Oku; Shinichi Miyakuni; Nobuyuki Kasai, all of Itami; Yasutaka Kohno, deceased, late of Saijyo, all of Japan, by Yoko Kohno, heir/legal representative

[73] Assignee: Mitsubishi Denki Kabushiki Kaisha, Tokyo, Japan

[21] Appl. No.: 748,912

[22] Filed: Nov. 15, 1996

Related U.S. Application Data

[62] Division of Ser. No. 498,635, Jul. 6, 1995, abandoned.

[30] Foreign Application Priority Data

Jul. 6, 1994 [JP] Japan .................................. 6-154717

[51] Int. Cl.$^6$ ................................................. H01L 21/338
[52] U.S. Cl. ........................ 438/174; 438/589; 438/591; 438/167
[58] Field of Search .................................. 438/167, 169, 438/172, 174, 181, 185, 187, 576, 573, 519, 521, 589, 591

[56] References Cited

U.S. PATENT DOCUMENTS

| 4,829,347 | 5/1989 | Cheng et al. | 257/283 |
| 5,389,574 | 2/1995 | Mizunuma | 438/167 |
| 5,436,489 | 7/1995 | Murase | 257/344 |
| 5,471,073 | 11/1995 | Kohno | 257/284 |
| 5,486,710 | 1/1996 | Kitano | 257/284 |

FOREIGN PATENT DOCUMENTS 63-142681  6/1988  Japan .

OTHER PUBLICATIONS

Hayama et al., "Emitter Size Effect On Current Gain In Fully Self–Aligned AlGaAs/GaAs HBT's With AlGaAs Surface Passivation Layer", IEEE Electron Device Letters, vol. 11, No. 9, 1990, pp. 388–390 No Month.

Noda et al., "A High–Speed And Highly Uniform Submicrometer–Gate BPLDD GaAs MESFET For GaAs LSI's", IEEE Transactions on Electron Devices, vol. 39, No. 14, 1992, pp. 737–766 No Month.

"Fabrication Technology, Device Parameters, And Equivalent Circuit", Gallium Arsenide by Howes et al., 1985, pp. 370–383 No Month.

Hanyu et al., "Super Low Noise HEMTs With A T–Shaped $WSi_x$ Gate", Electronics Letters, vol. 24, No. 21, 1988, pp. 1327–1328 No Month.

*Primary Examiner*—Charles Bowers
*Assistant Examiner*—Scott J. Hawranek
*Attorney, Agent, or Firm*—Leydig, Voit & Mayer

[57] ABSTRACT

A method of making a semiconductor device includes forming a recess in a compound semiconductor substrate using a patterned insulating film on a surface of the substrate, implanting dopant ions at the bottom of the recess to form a channel region, and depositing a refractory metal film. The refractory metal film is etched, using a resist pattern, to form a gate electrode and additional dopant ions are implanted to form relatively highly doped regions intersecting the channel region. Very highly doped regions are formed my implantation, after removing the insulating film, using the gate electrode and remainder of the resist mask as an implantation mask. After stripping the resist, annealing to activate the implanted ions, and depositing a passivating film on the substrate and gate electrode, source and drain electrodes are formed. The field effect transistor thus produced has a high breakdown voltage, improved reliability, a highly controlled pinch-off voltage, and improved transconductance and operating speed.

7 Claims, 32 Drawing Sheets

$L'_{DL} > L_{DL}$

Fig.25 (a) (Prior Art)
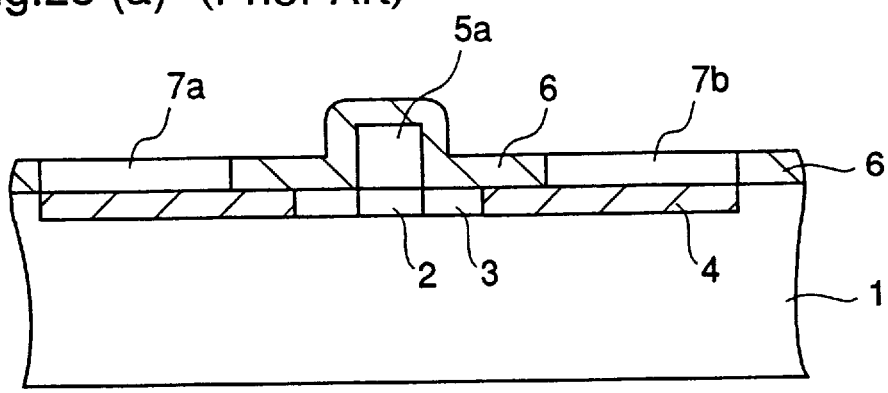
Fig.25 (b) (Prior Art)
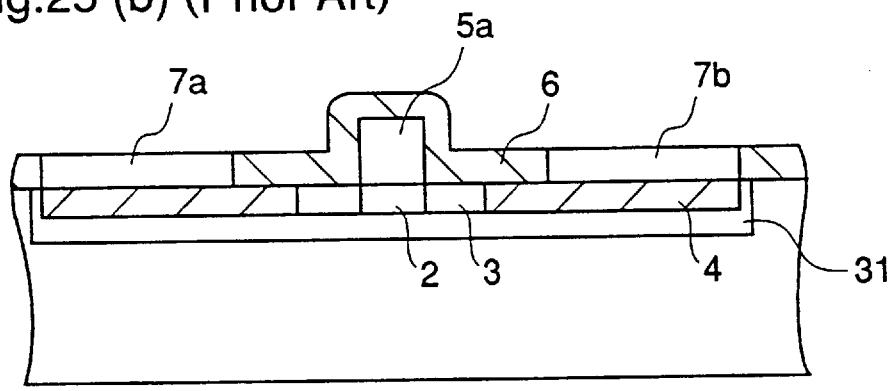

Fig.26 (a) (Prior Art)
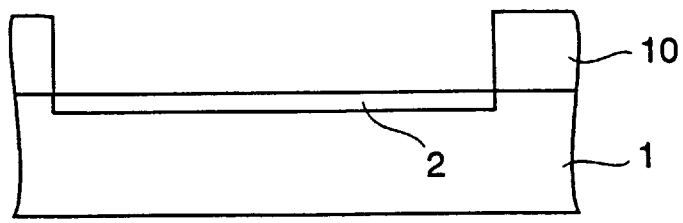
Fig.26 (b) (Prior Art)
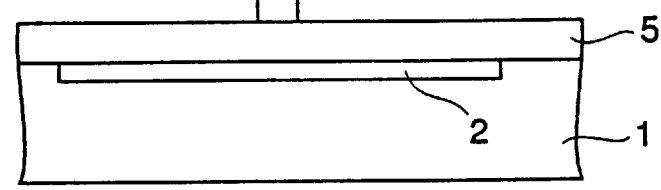
Fig.26 (c) (Prior Art)
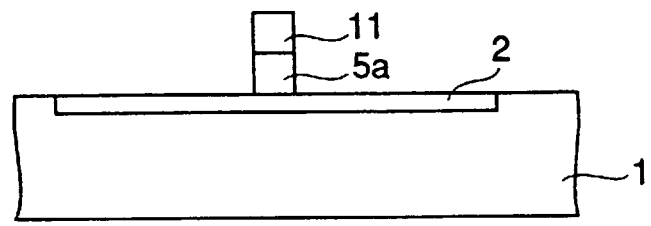
Fig.26 (d) (Prior Art)
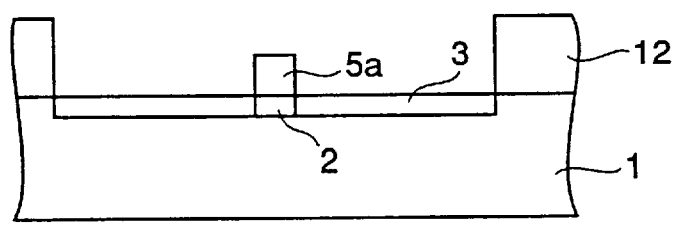
Fig.26 (e) (Prior Art)
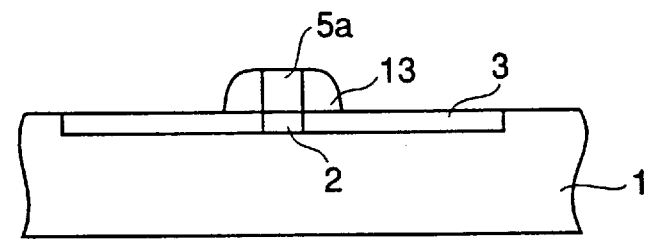
Fig.26 (f) (Prior Art)
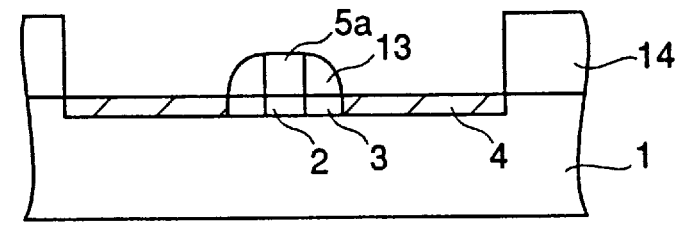
Fig.26 (g) (Prior Art)
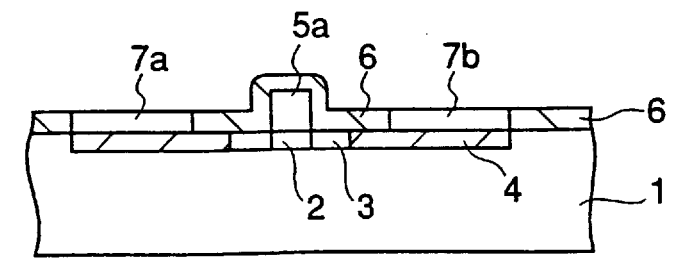

Fig.28 (a) (Prior Art)
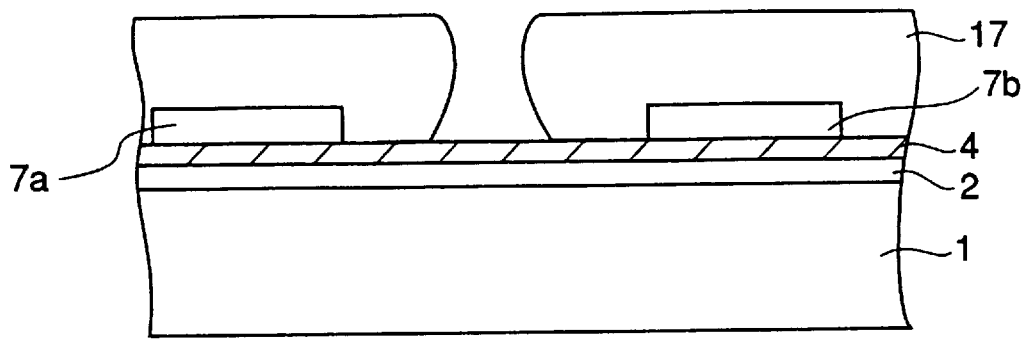
Fig.28 (b) (Prior Art)
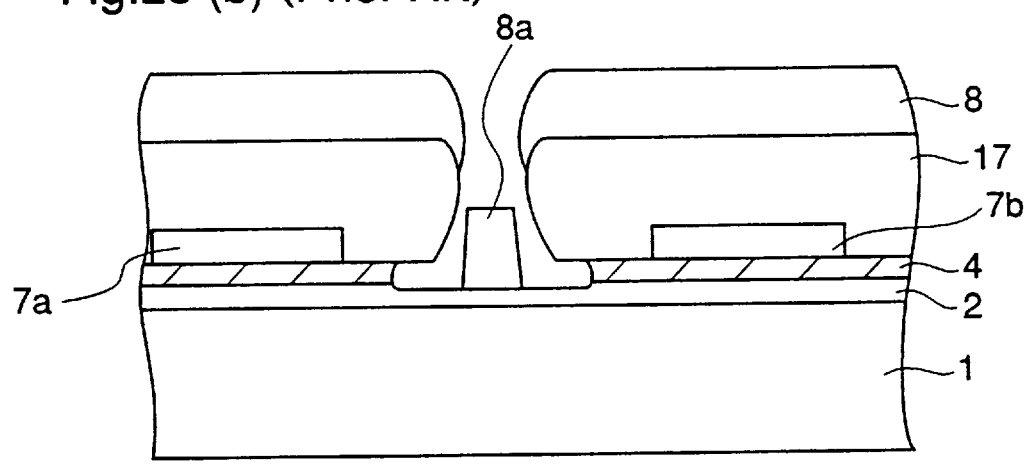
Fig.28 (c) (Prior Art)
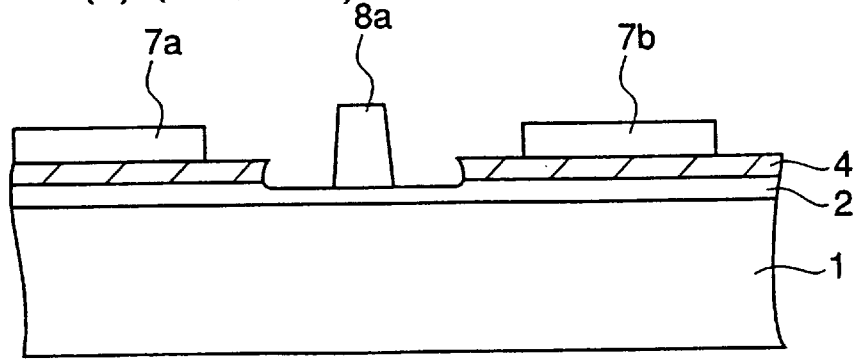

Fig.30 (a) (Prior Art)
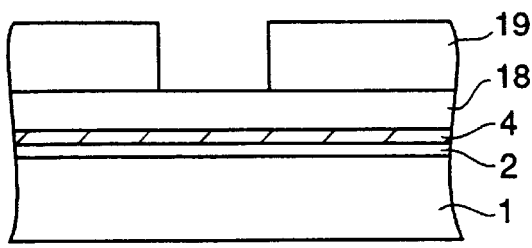
Fig.30 (b) (Prior Art)
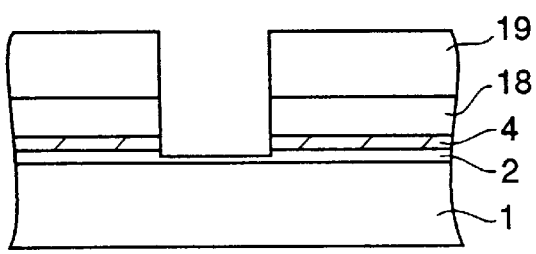
Fig.30 (c) (Prior Art)
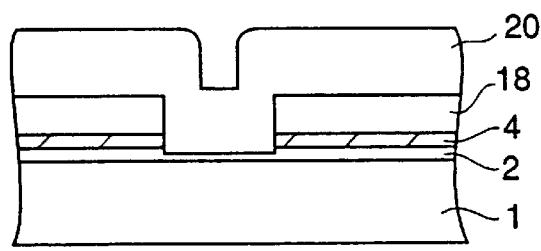
Fig.30 (d) (Prior Art)
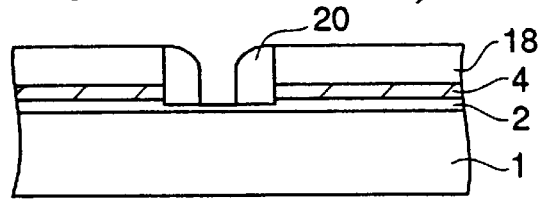
Fig.30 (e) (Prior Art)
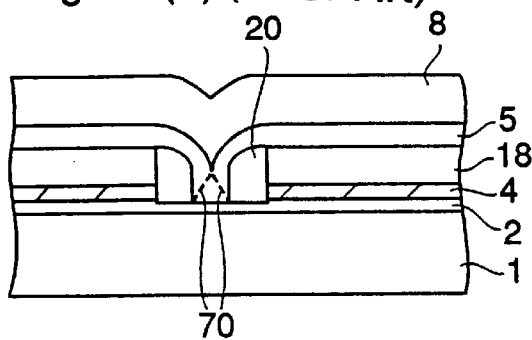
Fig.30 (f) (Prior Art)
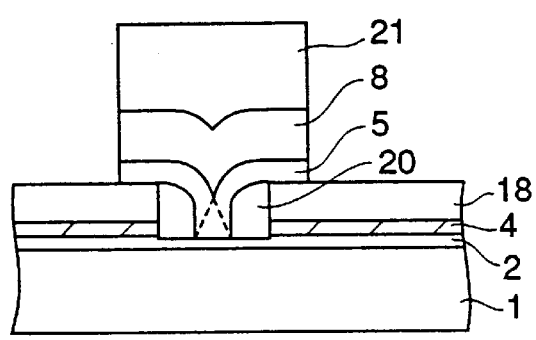
Fig.30 (g) (Prior Art)
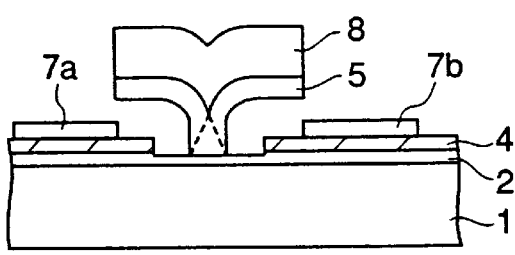
Fig.30 (h) (Prior Art)
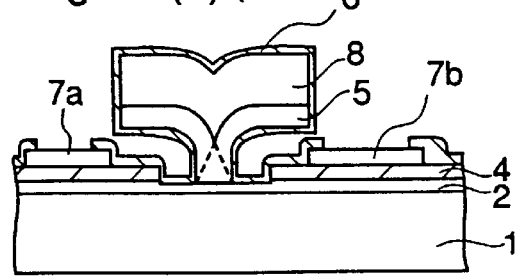

Fig.31 (Prior Art)
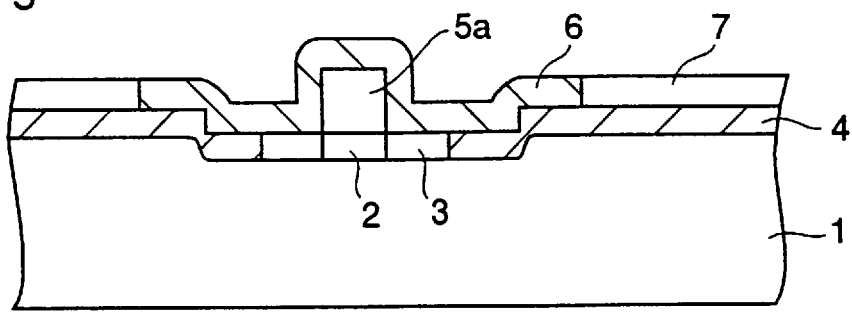
Fig.32 (a) (Prior Art)
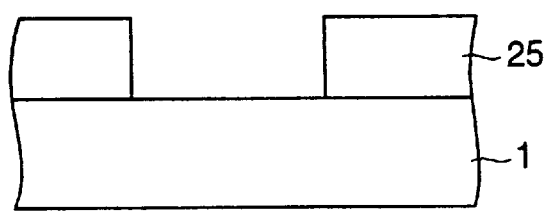
Fig.32 (b) (Prior Art)
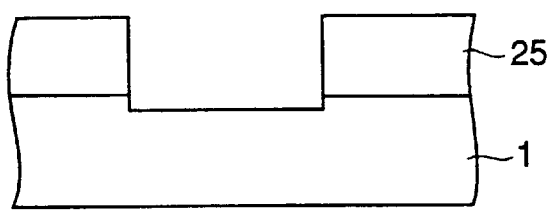
Fig.32 (c) (Prior Art)
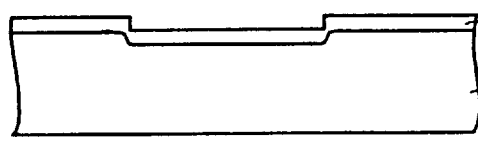
Fig.32 (d) (Prior Art)
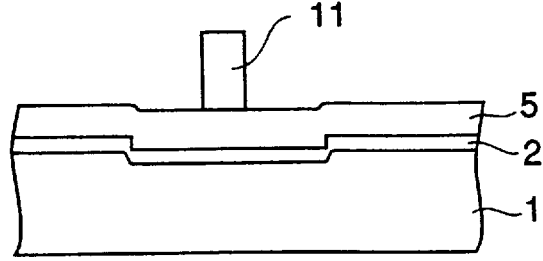
Fig.32 (e) (Prior Art)
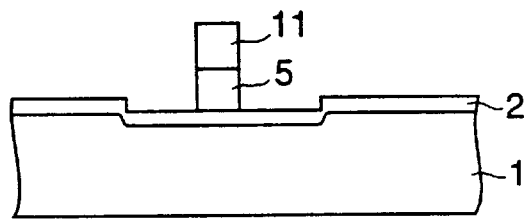
Fig.32 (f) (Prior Art)
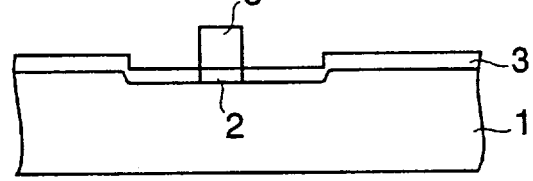
Fig.32 (g) (Prior Art)
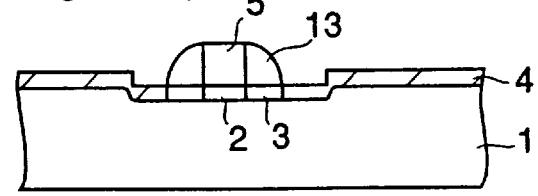
Fig.32 (h) (Prior Art)
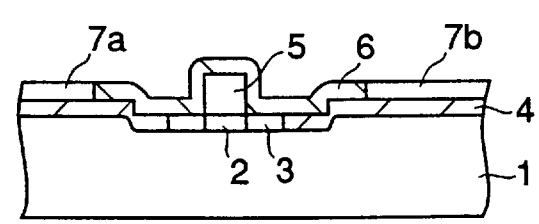

Fig.34 (a) (Prior Art)
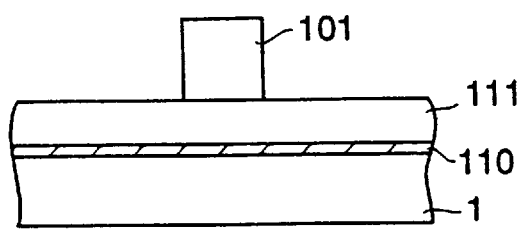
Fig.34 (b) (Prior Art)
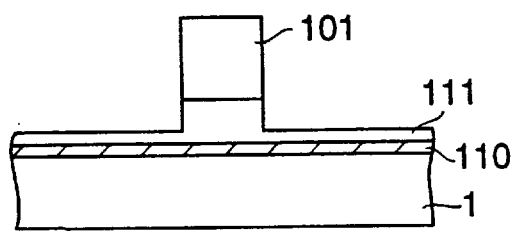
Fig.34 (c) (Prior Art)
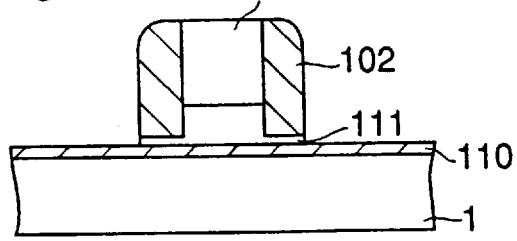
Fig.34 (d) (Prior Art)
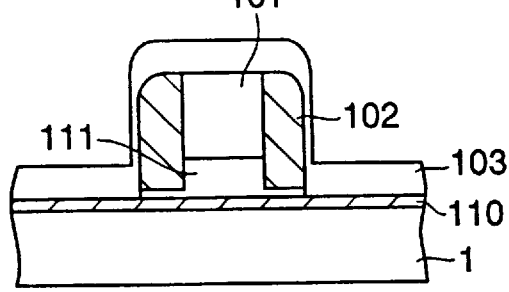
Fig.34 (e) (Prior Art)
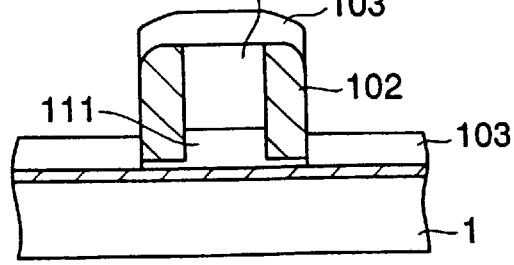
Fig.34 (f) (Prior Art)
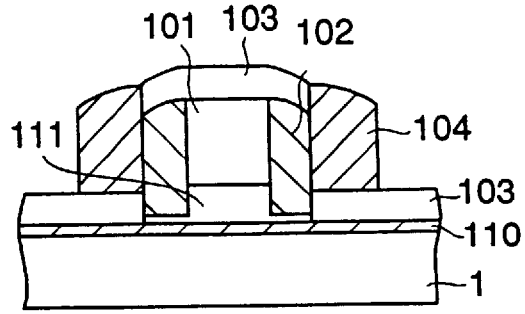
Fig.34 (g) (Prior Art)
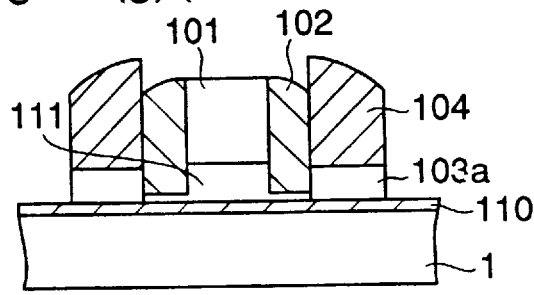
Fig.34 (h) (Prior Art)
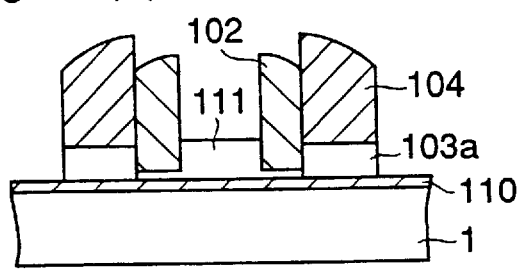
Fig.34 (i) (Prior Art)
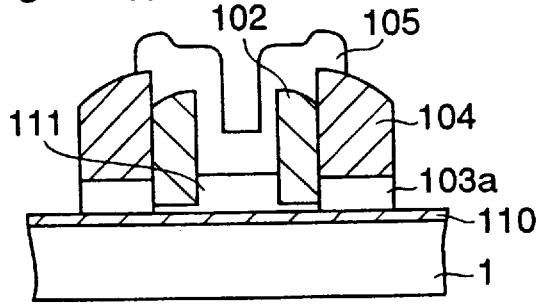

5,888,859

METHOD OF FABRICATING SEMICONDUCTOR DEVICE

This disclosure is a division of patent application Ser. No. 08/498,635, filed Jul. 6, 1995, now abandoned.

FIELD OF THE INVENTION

The present invention relates to semiconductor devices, such as field effect transistors and heterojunction bipolar transistors, including refractory metal electrodes. The invention also relates to methods of fabricating the semiconductor devices.

BACKGROUND OF THE INVENTION

In field effect transistors (hereinafter referred to as FETs) employing compound semiconductors, n type layers are usually used as active layers, such as channel layers. Hereinafter the channel is called an n layer. In addition, a layer disposed beneath the channel layer and containing a dopant impurity producing a conductivity type opposite the conductivity type of the channel layer, i.e., n type, is a p type layer. This p type layer is called a buried p layer.

In conventional planar type compound semiconductor FETs, in order to reduce the source resistance and the drain resistance and increase the transconductance, high dopant concentration layers (hereinafter referred to as $n^+$ layers) having an n type dopant concentration higher than that of the n layer are arranged adjacent to both sides of the n layer directly under a gate electrode. Those $n^+$ layers are produced by ion implantation using the gate electrode as a mask, i.e., self-alignedly with the gate electrode. Generally, a refractory metal is employed for the gate electrode because the substrate after the ion implantation is annealed to activate the implanted ions. In this structure, however, the capacitance between the gate electrode and the $n^+$ layers becomes an obstacle to high-speed operation of the FET. In addition, when the gate length is less than 1.0 μm, the short channel effect occurs. Therefore, in recent years, LDD (Lightly Doped Drain) FETs have been employed, in which intermediate dopant concentration layers (hereinafter referred to as n' layers) having a dopant concentration higher than the dopant concentration of the n layer and lower than the dopant concentration of the $n^+$ layers are interposed between the n layer and the $n^+$ layers. FIG. 25(a) shows an example of the prior art planar LDD-FET. In the figure, reference numeral 1 designates a compound semiconductor substrate. An n type channel layer 2 is disposed on a center part of the substrate 1. N' layers 3 are disposed at opposite sides of and in contact with the n layer 2. $N^+$ layers 4 are disposed contacting the n' layers 3. A refractory metal gate electrode 5a is disposed on the n layer 2, and ohmic electrodes 7a and 7b are disposed on the $n^+$ layers 4. Reference numeral 6 designates an insulating film.

FIGS. 26(a)–26(g) illustrate process steps in a method of fabricating the LDD-FET shown in FIG. 25(a).

Initially, as illustrated in FIG. 26(a), a resist pattern 10 is formed on the compound semiconductor substrate 1. Using the resist pattern 10 as a mask, n type dopant ions are implanted into the substrate to a prescribed depth, forming an n layer 2. The pinch-off voltage $V_p$ of the FET is controlled by the implanted depth that depends on the accelerating energy and the dose. For example, when Si ions are implanted at an accelerating energy of 70 keV and a dose of $7 \times 10^{12}$ cm$^{-2}$, the pinch-off voltage $V_p$ is –2.0 V.

In the step of FIG. 26(b), after removal of the resist pattern 10, a thin refractory metal film 5 is deposited on the substrate, and a gate pattern 11 comprising a resist is formed on a portion of the refractory metal film 5. Preferably, WSi, WSiN, WN, or TiW is employed as the thin refractory metal film 5 as described in Japanese Published Patent Application No. Sho. 63-142681.

In the step of FIG. 26(c), using the resist pattern 11 as a mask, the thin refractory metal film 5 is etched by reactive ion etching (hereinafter referred to as RIE), forming a gate electrode 5a. When a gas mixture of $CF_4+O_2$ or $SF_6+CHF_3$ is employed for the RIE, the refractory metal film 5 is vertically etched without pattern-shifting from the resist pattern 11.

In the step of FIG. 26(d), after removal of the resist pattern 11, a resist pattern 12 is formed on the substrate. Using the resist pattern 12 and the refractory metal gate electrode 5a as masks, ion implantation is carried out to form the n' layers 3. The depth of the n' layers 3 from the surface of the substrate is approximately equal to the depth of the n layer 2.

After removal of the resist pattern 12, as illustrated in FIG. 26(e), an insulating film 13 is deposited on the substrate and etched back leaving portions on the both sides of the refractory metal gate electrode 5a. Hereinafter, the left portions 13 are called side walls. Preferably, an $SiO_2$ film is used as the insulating film 13, and the etchback is carried out by RIE using a gas mixture of $CHF_3+O_2$.

Thereafter, as illustrated in FIG. 26(f), a resist pattern 14 is formed on the substrate and, using the resist pattern 14, the refractory metal gate electrode 5a, and the side walls 13 as masks, ion implantation for producing the $n^+$ layers 4 is carried out. The depth of the $n^+$ layers 4 is approximately equal to the depth of the n layer 2.

After removal of the resist pattern 14 and the side walls 13, annealing is performed at about 800° C. to activate the ions in the n layer 2, the n' layers 3, and the $n^+$ layers 4. Finally, the insulating film 6 and the source and drain ohmic electrodes 7a and 7b are produced to complete the structure shown in FIG. 26(g). The annealing may be performed twice, i.e., first annealing for activating the n layer 2 and second annealing for activating the n' and $n^+$ layers 3 and 4. In the step of implanting the n type dopant shown in FIG. 26(a), not only the n type dopant but also a p type dopant may be implanted to a depth exceeding the depth of the n layer 2 to form a buried p layer 31 under the active layers 2, 3, and 4 as shown in FIG. 25(b). This buried p layer 31 suppresses the short channel effect in an FET having a gate length less than 1.0 μm. An FET having such structure is described by M. Noda et al. in IEEE Transactions on Electron Devices, Vol. 39 (1992), p.757. This FET is called a buried p layer LDD-FET (hereinafter referred to as BPLDD-FET). In this structure, the depletion layer is thinner at the interface between the $n^+$ layer 4 and the buried p layer 31 than at interface between the n layer 2 and the buried p layer 31. Likewise, the capacitance is larger at the former interface than at the latter interface. Although the buried p layer 31 under the $n^+$ layer 4 does not contribute to suppressing the short-channel effect, the capacitance at the interface between the p layer 31 and the $n^+$ layer 4 reduces the operating speed of the FET. So, the buried p layer 31 may be produced by implanting the p type dopant after masking the $n^+$ layers 4 with a resist pattern to prevent the p type dopant from being implanted into regions under the $n^+$ layers. In this case, however, the resist pattern is not formed self-alignedly with the $n^+$ layers 4.

In the FET fabricated as described above, since ion implantation is employed for the formation of the n layer 2, the controllability of the pinch-off voltage $V_p$ is good. In addition, since the gate electrode 5a comprises a refractory metal, the reliability of the contact between the gate electrode 5a and the n layer 2 is high. However, since current flows in the vicinity of the surface of the active layer, the drain breakdown voltage is low.

Meanwhile, FIG. 27 shows another example of a prior art compound semiconductor FET disclosed by B. Turner in Gallium Arsenide edited by M. J. Howes and D. V. Morgat, 1985, John Wiley & Sons Ltd, Chapter 10, p.377. This FET comprises a compound semiconductor substrate 1, an n layer 2 disposed on the substrate 1, an $n^+$ layer 4 disposed on the n layer 2, a recess having a bottom within the n layer 2, and a low resistance metal gate electrode 8 disposed in the recess, and ohmic electrodes 7a and 7b disposed on the $n^+$ layer 4 at opposite sides of the gate electrode 8.

A fabricating method of the FET with the recess structure shown in FIG. 27 is illustrated in FIGS. 28(a)–28(c). Initially, as illustrated in FIG. 28(a), on the compound semiconductor substrate 1 having the n layer 2 and the $n^+$ layer 4, the ohmic electrodes 7a and 7b are produced contacting the $n^+$ layer 4. Then, a resist film 17 having a prescribed opening pattern is formed on the substrate.

Thereafter, as shown in FIG. 28(b), using the resist film 17 as a mask, the $n^+$ layer 4 and the n layer 2 are wet-etched with tartaric acid to form a recess, followed by deposition of a low resistance metal film 8. Preferably, Ti/Au or Ti/Al is employed for the low resistance metal film 8.

In the step of FIG. 28(c), the resist film 17 is dissolved with an organic solvent to lift-off unnecessary portions of the low resistance metal film 8 on the resist film 17, thereby producing the low resistance metal gate electrode 8. Since the same resist pattern 17 is used for the formation of the recess and the formation of the gate electrode, the gate electrode is formed self-alignedly with the recess.

In the FET with the recess structure fabricated as described above, current flows in a deeper region in the active layer than in the above-described BPLDD-FET, so that current concentration at the drain edge is reduced and the drain breakdown voltage is high. However, since it is difficult to accurately control the etching of the recess, the controllability of the pinch-off voltage $V_p$ is poor. In addition, since the gate electrode 8a comprises a low resistance metal, the reliability of the contact between the gate electrode and the n layer is low as compared to the FET employing the refractory metal gate electrode. In the structure shown in FIG. 27, the gate length is determined by the width of the opening of the resist film 17.

As described above, when a low resistance metal is used for the gate electrode, the reliability of the contact between the gate electrode and the n layer is not satisfactory. The reliability of the contact can be improved by a gate electrode having a double-layer structure in which a low resistance metal gate is disposed on a refractory metal gate. A compound semiconductor FET having such gate structure is disclosed by I. Hanyu et al. in Electronics Letters, Vol. 24 (1988), p.1327. FIG. 29 shows the FET structure. This FET comprises a compound semiconductor substrate 1, an n layer 2 disposed on the substrate 1, an $n^+$ layer 4 disposed on the n layer 2, a recessed gate electrode comprising a refractory metal layer 5 and a low resistance metal layer 8, ohmic electrodes 7a and 7b disposed on the $n^+$ layer 4 at opposite sides of the gate electrode, and an insulating film 6 covering the surface of the structure except upper surfaces of the ohmic electrodes 7a and 7b. Reference numeral 70 designates a porous portion of the refractory metal layer 5.

Although in the above-described literature the n layer 2 has a double-layer structure of AlGaAs/GaAs, since the structure of the n layer matters little to the description about the structure and fabricating process of the gate electrode, a single n layer will be used in the following description.

FIGS. 30(a)–30(h) illustrate process steps in a method of fabricating the FET having the gate electrode with the double-layer structure comprising a refractory metal and a low resistance metal. Initially, a compound semiconductor substrate on which an n layer 2 and an $n^+$ layer 4 are produced by epitaxial growth or ion implantation is prepared. As illustrated in FIG. 30(a), an insulating film 18 is deposited on the substrate and a resist film 19 having a desired opening pattern is formed on the insulating film 18. Thereafter, as illustrated in FIG. 30(b), using the resist film 19 as a mask, the insulating film 18 is etched and, subsequently, the $n^+$ layer 4 and the n layer 2 are etched to form a recess. This etching is stopped within the n layer 2. When the insulating film 18 comprises $SiO_2$, it is etched by RIE with a gas mixture of $CHF_3+O_2$. The $n^+$ layer 4 and the n layer 2 are etched by plasma etching with $Cl_2$ or wet etching with tartaric acid.

In the step of FIG. 30(c), after removal of the resist film 19, an insulating film 20 is deposited over the substrate. The gate length is determined by the thickness of the insulating film 20 and the width of the opening pattern of the resist film 19. Thereafter, as illustrated in FIG. 30(d), the insulating film 20 is etched back, leaving portions on the inner side surfaces of the recess. Then, as illustrated in FIG. 30(e), a refractory metal film 5 comprising, for example, WSi, WSiN, or WN, is deposited by sputtering or the like, followed by annealing. After the annealing, a low resistance metal film 8 comprising, for example, Au, is deposited. Since the refractory metal film 5 is formed by sputtering of WSi, WSiN, or WN, the underlying n layer 2 is damaged. Therefore, annealing is required before the deposition of the low resistance metal film 8. This annealing is performed at 400°–500° C. Further, the refractory metal film 5 has porous portions 70 shown by dotted lines in FIG. 30(e) because of the difference in level, i.e., steps, on the substrate.

Thereafter, as shown in FIG. 30(f), a resist pattern 21 is formed on the low resistance metal film 8 and, using this resist pattern 21 as a mask, the low resistance metal film 8 is etched by ion milling with Ar gas and the refractory metal film 21 is etched by RIE with a gas mixture of $CF_4+O_2$ or $CHF_3+SF_6$. Further, as illustrated in FIG. 30(g), the resist pattern 21, the insulating film 18, and the insulating film 20 are removed, and source and drain ohmic electrodes 7a and 7b are formed on the $n^+$ layer 4 at opposite sides of the gate electrode. Finally, as illustrated in FIG. 30(h), an insulating film 6 is deposited over the entire surface and portions of the insulating film 6 on the ohmic electrodes 7 are etched away. The gate electrode has a V-shaped hollow in the center of the top surface. Also in this fabricating process, the gate electrode is produced self-alignedly with the recess.

In the FET fabricated as described above, because the recess structure is employed, a high drain breakdown voltage is realized. In addition, the refractory metal layer 5 of the gate electrode is in contact with the n layer 2, so the reliability of the contact between the gate electrode and the n layer is high. However, since the recess is formed by etching, it is difficult to accurately control the pinch-off voltage $V_p$. Further, since the refractory metal layer 5 of the gate electrode includes the porous portion 70 shown by the dotted line in FIG. 29, there is a possibility of abnormal diffusion of the low resistance metal layer 8 into the refractory metal layer 5.

FIG. 31 shows a prior art FET combining advantages of both the planar LDD-FET and the recessed gate FET, i.e., an FET providing high breakdown voltage, high reliability, and high $V_p$ controllability. In this FET, a gate electrode 5a is disposed in a recess while active layers 2, 3, and 4 are in an LDD structure.

FIGS. 32(a)–32(h) illustrate process steps in a method of fabricating the FET shown in FIG. 31. Initially, a recess is formed in a compound semiconductor substrate 1 using an etching technique with a resist mask 25. The process steps after the formation of the recess (FIGS. 32(c)–32(h)) are identical to the fabricating process of the LDD-FET already described with respect to FIGS. 26(a)–26(g). However, in the FET fabricated by this method, in contrast to the recessed gate FETs fabricated by the above-described methods shown in FIGS. 28(a)–28(c) and FIGS. 30(a)–30(h), since the gate electrode is not formed self-alignedly with the recess, the uniformity of the FET characteristics and their reproducibility are poor, so that good production yield is not obtained.

A description is given of a prior art method of fabricating a heterojunction bipolar transistor (hereinafter referred to as HBT). FIG. 33 is a sectional view of an HBT disclosed by N. Hayama and K. Honjo in IEEE Electron Device Letters, Vol. 11 (1990), p. 388. In this HBT structure, it is necessary to form an emitter electrode (E in the figure) self-alignedly with base electrodes (B in the figure), and the emitter electrode E is spaced apart from the base electrodes B using SiO$_2$ side walls. A method of fabricating the HBT is illustrated in FIGS. 34(a)–34(i). Although a collector layer is not shown in the figures, it is included in the compound semiconductor substrate 1.

Initially, as illustrated in FIG. 34(a), a base layer 110 and an emitter layer 111 are epitaxially grown on the compound semiconductor substrate 1. Then, an SiN film is deposited over the emitter layer 111 and patterned by photolithography and etching to leave a portion 101 on a region where an emitter electrode is later produced.

In the step of FIG. 34(b), using the SiN film 101 as a mask, the structure is dry-etched using Cl$_2$ gas until the etching front reaches into the emitter layer 111, forming a mesa structure for an emitter electrode. Thereafter, as illustrated in FIG. 34(c), an SiO$_2$ film is deposited over the entire surface and etched back to form first SiO$_2$ side walls 102 on both sides of the mesa structure. Further, portions of the emitter layer 111 outside the first side walls 102 are wet-etched until the surface of the base layer 110 is exposed.

In the step of FIG. 34(d), a base metal 103, such as AuMn, is deposited over the structure by vacuum evaporation. Then, as illustrated in FIG. 34(e), the base metal 103 is subjected to diagonal ion-milling to remove portions of the base metal 103 slightly deposited on the side surfaces of the SiO$_2$ side walls 102. Thereafter, second SiO$_2$ side walls 104 are formed in the same process as the first SiO$_2$ side walls 102 as shown in FIG. 34(f).

In the step of FIG. 34(g), using the second side walls 104 as masks, the base metal 103 is etched by ion-milling, forming base electrodes 103a. Thereafter, as illustrated in FIG. 34(h), the SiN film 101 is selectively removed so as not to remove the first and second SiO$_2$ side walls 102 and 104. This selective removal is easily carried out by plasma etching with SF$_6$ gas. Finally, as illustrated in FIG. 34(i), an emitter electrode 105 is formed to complete the structure shown in FIG. 33.

In the above-described method, however, when the SiO$_2$ film is etched back by RIE to form the SiO$_2$ side walls, the substrate is damaged or undesirably etched, resulting in degradation in device characteristics and increased variations of the device characteristics. In addition, since diagonal ion-milling is used for removal of the base metal, the device characteristics are degraded as a result of imperfect etching with residual or excess etching.

According to the above-described prior art FETs, the planar LDD-FET employing a refractory metal gate (FIG. 25(a)) has a low drain breakdown voltage, and the recessed gate FET employing a refractory metal gate (FIG. 29) has a poorly controlled pinch-off voltage $V_p$. Further, in the prior art FET employing both the recessed gate structure and the LDD structure in order to solve the above-described problems (FIG. 31), since the refractory metal gate is not self-aligned with the recess, good yield is not achieved. Furthermore, in the prior art BPLDD-FET employing a buried p layer for suppressing the short channel effect (FIG. 25(b)), although the buried p layer is desired to be absent under the n$^+$ layer, in other words, present only under the n and n' layers, in order to remove the capacitance between the p layer and the n$^+$ layers, since the buried p layer cannot be produced self-alignedly with the n$^+$ layers, the capacitance between the buried p layer and the n$^+$ layer remains, resulting in a reduction in the operating speed.

On the other hand, in the prior art HBT shown in FIG. 33, the RIE for forming the SiO$_2$ side walls and the diagonal ion-milling for removing unnecessary portions of the base metal adversely affect the device characteristics and increase the variations in the device characteristics.

SUMMARY OF THE INVENTION

An object of the present invention is to provide an FET having a high breakdown voltage, improved reliability, high controllability of pinch-off voltage, good yield, improved transconductance, and increased operating speed.

Another object of the present invention to provide an HBT with improved characteristics and suppressed variations in the characteristics.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, an FET includes a compound semiconductor body having a recess at the surface, and a refractory metal gate electrode disposed in the center of the recess and having a smooth and flat or arched top surface. In this FET, since the gate electrode comprises a refractory metal, a highly-reliable contact is realized between the gate electrode and the compound semiconductor body. Furthermore, since the recess structure is employed, the current concentration at edges of source and drain electrodes is reduced, resulting in a high drain breakdown voltage.

According to a second aspect of the present invention, in the above-described FET, the compound semiconductor body comprises a compound semiconductor substrate; a channel layer (hereinafter referred to as n layer) comprising a compound semiconductor containing an n type dopant impurity and located on a region of the surface of the compound semiconductor substrate directly under the gate electrode; intermediate dopant concentration layers (hereinafter referred to as n' layers) comprising the compound semiconductor containing the n type dopant impurity and having a dopant concentration higher than the dopant concentration of the n layer, located on regions of the surface of the compound semiconductor substrate under the recess where the n layer is absent; and high dopant concentration layers (hereinafter referred to as $n^+$ layers) comprising the compound semiconductor containing the n type dopant impurity and having a dopant concentration higher than the dopant concentration of the n' layers, located on regions of the surface of the compound semiconductor substrate other than the region under the recess so as to sandwich the recess. In this structure, since the n' layers are adjacent to both ends of the gate electrode, the source-to-drain resistance is reduced compared to the prior art FET, increasing the transconductance. In addition, since the recess structure is employed, the breakdown voltage is high. Further, since the gate electrode comprises a refractory metal, the reliability of the contact between the gate electrode and the compound semiconductor active layer is improved.

According to a third aspect of the present invention, in the FET according to the second aspect, the compound semiconductor body includes the $n^+$ layers in regions under the recess and adjacent to the opposite side surfaces of the recess. Therefore, the source-to-drain resistance is reduced as compared to the above-described structure in which the boundaries between the n' layers and the $n^+$ layers are aligned with the opposite side surfaces of the recess, thereby increasing the transconductance. In addition, since the gate electrode comprises a refractory metal, a highly-reliable contact is achieved between the gate electrode and the compound semiconductor active layer.

According to a fourth aspect of the present invention, in the FET according to the second aspect, the compound semiconductor body includes the n' layers in regions outside the region under the recess and adjacent to the both side surfaces of the recess. Therefore, the distance from the gate to the $n^+$ layer is increased as compared to the FET in which the $n'/n^+$ boundaries are aligned with the opposite side surfaces of the recess and the FET in which the $n'/n^+$ boundaries are outside the recess, whereby the drain breakdown voltage is increased. In addition, since the gate electrode comprises a refractory metal, a highly-reliable contact is achieved between the gate electrode and the compound semiconductor active layer.

According to a fifth aspect of the present invention, in the FET according to the first aspect, the compound semiconductor body comprises a compound semiconductor substrate, an n type channel layer comprising a compound semiconductor containing an n type dopant impurity and disposed over the surface of the compound semiconductor substrate, and $n^+$ layers comprising the compound semiconductor containing the n type dopant impurity and having a dopant concentration higher than the dopant concentration of the n layer and disposed on portions of the n layer outside the recess, and the recess has its bottom within the n layer. In this structure, compound semiconductor layers epitaxially grown on the compound semiconductor substrate in advance can be employed for the n layer and the $n^+$ layers, whereby a steep distribution of the dopant concentration is realized at the interface between the n layer and the compound semiconductor substrate and, further, the dopant concentration of the $n^+$ layers can be increased as compared to ion implantation, resulting in an FET with a higher transconductance than the transconductance of the FET in which the n and $n^+$ layers are formed by ion implantation. In addition, since the gate electrode comprises a refractory metal, a highly-reliable contact is achieved between the gate electrode and the compound semiconductor active layer. Furthermore, since the recess structure is employed, the drain breakdown voltage is high.

According to a sixth aspect of the present invention, the FET according to the fifth aspect further includes a low-resistance metal layer disposed just on the top surface of the refractory metal gate electrode. Therefore, a highly-reliable contact is obtained between the refractory metal gate and the compound semiconductor active layer and, at the same time, the gate resistance is significantly reduced because the upper part of the gate electrode is made of the low-resistance metal. Further, the gate-to-source capacitance and the gate-to-drain capacitance are reduced as compared to the prior art FET having the top-heavy refractory metal/low-resistance metal gate shown in FIG. 29. The reductions in the gate resistance, the gate-to-source capacitance, and the gate-to-drain capacitance improve the characteristics of the FET when operated in a high-frequency band. In addition, since the refractory metal gate according to the invention includes no porous portion differently from the prior art gate electrode shown in FIG. 29, the abnormal diffusion of the low-resistance metal into the refractory metal during the operation of the FET is avoided, thereby increasing the reliability. Further, since the refractory metal gate is in contact with the compound semiconductor active layer, a highly-reliable contact is achieved between the gate electrode and the compound semiconductor layer.

According to a seventh aspect of the present invention, the FET according to the first aspect further includes a low-resistance metal layer having a width larger than the width of the refractory metal gate and disposed on the refractory metal gate. Therefore, the gate resistance is further reduced compared to the gate structure in which the low-resistance metal gate is self-aligned with the refractory metal gate. In addition, since the refractory metal gate includes no porous portion differently from the prior art gate electrode shown in FIG. 29, the abnormal diffusion of the low-resistance metal into the refractory metal during the operation of the FET is avoided, thereby increasing the reliability. Further, since the refractory metal gate is in contact with the compound semiconductor active layer, a highly-reliable contact is achieved between the gate electrode and the compound semiconductor layer.

According to an eighth aspect of the present invention, in the FET according to the first aspect, the recess has a symmetrical multiple-stage structure, and the refractory metal gate electrode is disposed in the center of the innermost stage of the recess. Further, the compound semiconductor body comprises a compound semiconductor substrate; an n type channel layer comprising a compound semiconductor containing an n type dopant impurity and located on a region of the surface of the compound semiconductor substrate directly under the gate electrode; n' layers comprising the compound semiconductor containing the n type dopant impurity and having a dopant concentration higher than the dopant concentration of the n layer, located on regions of the surface of the compound semiconductor substrate under the recess where the n layer is absent so as to sandwich the n layer; and $n^+$ layers comprising the compound semiconductor containing the n type dopant impurity and having a dopant concentration higher than the dopant concentration of the n' layers, located on regions of the surface of the compound semiconductor substrate other than the regions where the n layer and the n' layers are present so as to contact the n' layers. Therefore, when the drain voltage is increased, the extension of the charge depletion layer between the gate and the drain toward the drain is facilitated as compared to the FET with the single-stage recess, whereby drain breakdown voltage is increased. Generally, the thicker the active layer is, the more the extension of the depletion layer in the horizontal direction is suppressed. Therefore, in the FET with the single-stage recess, after the depletion layer reaches an end of the recess on the drain side, the depletion layer hardly extends toward the drain even when the drain voltage is increased, and the electric field at the gate edge suddenly increases. On the other hand, in the FET with the multiple-stage recess, after the depletion layer reaches an end of the inner recess, the thickness of the active layer is not suddenly increased due to the presence of the outer recess, so that the increase in the electric field at the gate edge is suppressed, thereby increasing the drain breakdown voltage. In addition, since the width of the inner recess can be reduced without lowering the drain breakdown voltage, the gate-to-source resistance and the gate-to-drain resistance are reduced. Furthermore, since the gate electrode comprises a refractory metal, a highly-reliable contact is achieved between the gate electrode and the compound semiconductor active layer.

According to a ninth aspect of the present invention, a method of fabricating an FET includes preparing a compound semiconductor body having a surface; forming an insulating film on the surface of the compound semiconductor body and patterning the insulating film to form an opening; using the insulating film as a mask, forming a recess at the surface of the compound semiconductor body; depositing an refractory metal film on the insulating film and on the compound semiconductor body through the opening of the insulating film; applying a first resist over the refractory metal film and etching back the first resist, leaving a portion on a part of the refractory metal film opposite the opening of the insulating film; and using the first resist left on the refractory metal film as a mask, etching the refractory metal film to form a refractory metal gate electrode. In this method, since the refractory metal gate electrode and the recess are produced self-alignedly with each other, the uniformity and the reproducibility of the FET structure are improved. When the gate electrode is produced not self-alignedly with the recess but by an alignment technique using an exposure apparatus, a margin for the alignment precision of a gate pattern to the recess must be considered. In this method, since the gate electrode is produced self-alignedly with the recess, it is not necessary to leave that margin, whereby the width of the recess can be reduced. Furthermore, in this method, porous portions of the refractory metal film are completely etched away when the refractory metal is patterned to form a gate electrode, so that the completed gate electrode does not include porous portions, in contrast to the prior art gate electrode shown in FIG. 29. Therefore, when a low-resistance metal is produced on the refractory metal gate electrode, abnormal diffusion of the low-resistance metal into the refractory metal during the operating of the FET is avoided.

According to a tenth aspect of the present invention, in the method according to the ninth aspect, the refractory metal film is deposited using sputtering. Therefore, the surface of the refractory metal film deposited on the bottom of the recess is smooth and arched, resulting in a refractory metal gate electrode having a smooth and arched top surface.

According to an eleventh aspect of the present invention, in the method according to the ninth aspect, the refractory metal film is deposited using chemical vapor deposition. Therefore, the surface of the refractory metal film deposited on the bottom of the recess is smooth and flat, resulting in a refractory metal gate electrode having a smooth and flat top surface.

According to a twelfth aspect of the present invention, in the method according to the ninth aspect, the compound semiconductor body comprises a single compound semiconductor substrate, and the method further includes after formation of the recess and before deposition of the refractory metal film, using the insulating film as a mask, implanting n type dopant ions into the compound semiconductor substrate from the bottom of the recess to form an n type channel layer; after formation of the gate electrode, using the insulating film and the gate electrode as masks, implanting n type dopant ions into the compound semiconductor substrate to form n' layers having a dopant concentration higher than the dopant concentration of the n layer; applying a second resist over the entire surface of the structure so as to fill the space within the opening of the insulating film and etching back the second resist to leave a portion within the opening of the insulating film; after removal of the insulating film, using the gate electrode and the second resist left on both sides of the gate electrode as masks, implanting n type dopant ions into the compound semiconductor substrate to form $n^+$ layers having a dopant concentration higher than the dopant concentration of the n' layers; after removal of the second resist, annealing the compound semiconductor substrate to activate the implanted dopant ions; depositing an insulating film for passivation over the entire surface of the semiconductor substrate including the gate electrode; and producing spaced apart source and drain electrodes, followed by sintering. In this method, a refractory gate electrode having a smooth and flat or arched top surface is produced. Since the gate electrode comprises a refractory metal, a highly-reliable contact is realized between the gate electrode and the compound semiconductor substrate. Further, since the LDD structure is produced after the formation of the recess, the thickness and the dopant concentration of the n layer are determined by the ion implantation for forming the n layer and are not adversely affected by the etching process for forming the recess. As a result, reproducibility, uniformity, and controllability of electric characteristics of the FET are significantly improved. Further, since the gate electrode is produced self-alignedly with the n, n', and $n^+$ layers as well as with the recess, the reproducibility and the uniformity of the electric characteristics of the FET are improved, resulting in good yield. Also in this method, since the gate electrode is produced self-alignedly with the recess, it is not necessary to leave the above-described margin for the alignment precision of the gate pattern, so that the width of the recess can be reduced. As a result, the source resistance and the drain resistance are reduced, whereby the transconductance is increased and the reproducibility and the uniformity of the electric characteristics of the FET are improved. Furthermore, since the recess structure is employed, the current concentration at edges of the source and drain electrodes is reduced, resulting in a high drain breakdown voltage.

According to a thirteenth aspect of the present invention, the method according to the twelfth aspect further includes, after the removal of the second resist and before the annealing, depositing an insulating film over the entire surface of the compound semiconductor substrate including the gate electrode; etching back the insulating film to form side walls comprising portions of the insulating film on the both sides of the gate electrode so that the width of each side wall is smaller than the distance from the side of the gate electrode to the opposite end of the recess; using the side walls and the gate electrode as masks, implanting n type dopant ions into unmasked regions of the compound semiconductor substrate under the recess to form $n^+$ layers having a dopant concentration higher than the dopant concentration of the n' layers, followed by removal of the side walls. Therefore, an FET in which the $n^+$ layers are formed at the surface of the region under the recess that is not masked with the gate electrode and the insulating side walls is produced. In this FET, since the $n^+$ layers are located closer to the gate electrode than in the above-described FET in which the boundary between the n' layer and the $n^+$ layer is aligned with the recess, the source to drain resistance is reduced, thereby increasing the transconductance.

According to a fourteenth aspect of the present invention, in the method according to the ninth aspect, the compound semiconductor body comprises a single compound semiconductor substrate, and the method further includes, after formation of the recess and before deposition of the refractory metal film, using the insulating film as a mask, implanting n type dopant ions into the compound semiconductor substrate from the bottom of the recess to form an n type channel layer; after formation of the gate electrode, using the insulating film and the gate electrode as masks, implanting n type dopant ions into the compound semiconductor substrate to form first n' layers having a dopant concentration higher than the dopant concentration of the n layer; applying a second resist over the entire surface of the structure filling the space within the opening of the insulating film, and etching back the second resist to leave a portion within the opening of the insulating film; after removal of the insulating film, using the gate electrode and the second resist left on both sides of the gate electrode as masks, implanting n type dopant ions into the compound semiconductor substrate to form second n' layers having a dopant concentration equivalent to the dopant concentration of the first n' layers; after removal of the second resist, depositing a second insulating film over the entire surface of the compound semiconductor substrate including the gate electrode; etching back the second insulating film to form side walls comprising the second insulating film on the both sides of the gate electrode so that the width of each side wall is larger than the distance from the side of the gate electrode to the opposite end of the recess; using the side walls and the gate electrode as masks, implanting n type dopant ions to form $n^+$ layers having a dopant concentration higher than the dopant concentrations of the first and second n' layers; after removal of the side walls, annealing the compound semiconductor substrate to activate the implanted dopant ions; depositing an insulating film for passivation over the entire surface of the semiconductor substrate including the gate electrode; and producing spaced apart source and drain electrodes, followed by sintering. In this method, an FET in which the n' layers are formed on the surface of the compound semiconductor substrate outside the recess and adjacent to the side surface of the recess is obtained. In this FET, the distance from the gate electrode to the $n^+$ layer is increased as compared to the above-described FET in which the boundary between the n' layer and the $n^+$ layer is aligned with the recess and the FET in which portions of the $n^+$ layers are present under the recess. As a result, the drain breakdown voltage is increased.

According to a fifteenth aspect of the present invention, in the method according to the ninth aspect, the compound semiconductor body comprises a compound semiconductor substrate, an n type channel layer comprising a compound semiconductor containing an n type dopant impurity and disposed on the entire surface of the substrate, and an $n^+$ layer comprising a compound semiconductor containing the n type dopant impurity and having a dopant concentration higher than the dopant concentration of the n layer and disposed on the entire surface of the n layer. The method further includes using the insulating film as a mask, etching the compound semiconductor body to form a recess having a bottom within the n layer; after formation of the refractory metal gate electrode, removing the insulating film; depositing an insulating film for passivation over the entire surface of the compound semiconductor body including the gate electrode; and producing spaced apart source and drain electrodes, followed by sintering. Therefore, when epitaxially grown compound semiconductor layers can be employed for the n layer and the $n^+$ layer, whereby a steep distribution of the dopant concentration is obtained at the interface between the n layer and the compound semiconductor substrate and, further, the dopant concentration of the $n^+$ layer can be increased as compared to ion implantation, resulting in an FET with a higher transconductance than the transconductance of the FET in which the n and $n^+$ layers are formed by ion implantation.

According to a sixteenth aspect of the present invention, the method according to the fifteenth aspect further includes, after deposition of the refractory metal film, depositing a low-resistance metal film over the refractory metal film; applying the first resist over the low-resistance metal film and etching back the first resist, leaving a portion on a part of the low-resistance metal film opposite the opening of the insulating film; and using the first resist left on the low-resistance metal film as a mask, etching the low-resistance metal film and the refractory metal film to form a gate electrode. In this method, the refractory metal lower gate and the low-resistance metal upper gate are produced self-alignedly with each other. Since the refractory metal gate contacts the compound semiconductor body, the contact between them is highly reliable. In addition, since the gate electrode includes the low-resistance metal upper gate, the gate resistance is reduced. Further, in contrast to the head-heavy refractory metal/low-resistance metal gate structure according to the prior art shown in FIG. 29, the width of the low-resistance metal upper gate is equal to the width of the refractory metal lower gate, so that the gate to source capacitance and the gate to drain capacitance are reduced compared to the prior art FET shown in FIG. 29. Furthermore, in this method, porous portions of the refractory metal film are completely etched away when the refractory metal is patterned to form a gate electrode, so that the completed gate electrode does not include porous portions in contrast to the gate electrode shown in FIG. 29. Therefore, abnormal diffusion of the low-resistance metal into the refractory metal during the operating of the FET is avoided, thereby increasing the reliability.

According to a seventeenth aspect of the present invention, the method according to the fifteenth aspect further includes, after the formation of the refractory metal gate electrode and before the removal of the insulating film, depositing a third resist on the insulating film and on the surface of the compound semiconductor body including the refractory metal gate electrode; etching back the third resist until the surface of the third resist is in the same level as the top surface of the refractory metal gate electrode to expose the top surface of the refractory metal gate electrode; forming a low-resistance metal film on the top surface of the refractory metal gate electrode and on prescribed part of the third resist; and removing the third resist. In this method, a low-resistance metal gate wider than the refractory metal gate is produced on the refractory metal gate, so that the gate resistance is further reduced compared to the above-described gate structure in which the refractory metal gate and the low-resistance metal gate are self-aligned with each other.

According to an eighteenth aspect of the present invention, the method according to the twelfth aspect further includes, after formation of the source and drain electrodes and sintering, depositing a coating film on the insulating film for passivation and on the source and drain electrodes; etching back the coating film until the surface of the coating film is in the same level as the top surface of the refractory metal gate electrode to expose the top surface of the refractory metal gate electrode; and forming a low-resistance metal film on the top surface of the refractory metal gate electrode and on prescribed part of the coating film. In this method, a low-resistance metal gate wider than the refractory metal gate is produced on the refractory metal gate, so that the gate resistance is further reduced compared to the above-described gate structure in which the refractory metal gate and the low-resistance metal gate are self-aligned with each other.

According to a nineteenth aspect of the present invention, the method according to the ninth aspect further includes using the insulating film as a mask, forming a first recess having a width larger than the width of the opening of the insulating film at the surface of the compound semiconductor body using an isotropic etching technique and, thereafter, forming a second recess having a width as large as the width of the opening of the insulating film using an anisotropic etching technique. Therefore, an FET including a recess with double stages which are produced self-alignedly with the gate electrode is realized. The FET with the double-stage recess provides a higher drain breakdown voltage than that of an FET with a single-stage recess. In addition, the gate-to-source resistance and the gate-to-drain resistance are reduced.

According to a twentieth aspect of the present invention, the FET according to the second aspect further includes a buried p layer disposed under the n layer and the n' layers. In this FET, a p-n junction is produced at the interface between the buried p layer and the n and n' layers, and the p-n junction suppresses leakage current flowing through the interface between the substrate and the n layer between the source side n' and n$^+$ layer and the drain side n' and n$^+$ layers, which leakage current causes short channel effect in an FET having a gate length shorter than 1.0 $\mu$m. Furthermore, since the buried p layer is not present under the n$^+$ layers, the parasitic capacitance due to the buried p layer is reduced compared to the prior art BPLDD-FET, whereby the operating speed is increased. The buried p layer under the n$^+$ layers does not contribute to reduction of the short channel effect.

According to a twenty-first aspect of the present invention, the method according to the twelfth aspect further includes, after formation of the recess and before deposition of the refractory metal film, using the insulating film as a mask, implanting p type dopant ions into the compound semiconductor substrate to form a p layer beneath the n layer. In this method, an FET in which the buried p layer are disposed under the n and n$^+$ layers self-alignedly with these layers is realized. Therefore, as described above, the short channel effect is suppressed compared to an FET having no buried p layer. Further, the buried p layer is formed self-alignedly with the n and n' layers, the p layer is not formed under the n$^+$ layers. Therefore, the parasitic resistance due to the p layer is significantly reduced compared to the prior art BPLDD-FET, thereby increasing the operating speed.

According to a twenty-second aspect of the present invention, a method of fabricating a heterojunction bipolar transistor having a mesa structure in which a refractory metal gate is disposed in the center includes preparing a compound semiconductor body; depositing an insulating film on the surface of the compound semiconductor body and removing a portion of the insulating film using a taper-etching technique, thereby forming an opening having a width that is gradually reduced toward the surface of the compound semiconductor body; depositing a refractory metal film on the insulating film and on the compound semiconductor body in the opening; applying a first resist over the refractory metal film and etching back the first resist, leaving a portion on the refractory metal film opposite the opening of the insulating film; using the first resist left on the refractory metal film as a mask, etching the refractory metal film to form a refractory metal gate electrode in the center of the opening of the insulating film; using the insulating film and the refractory metal electrode as a masks, etching the compound semiconductor body; after removal of the first resist, applying a second resist on the insulating film and on the surface of the compound semiconductor body including the refractory metal electrode so as to fill the opening of the insulating film with the second resist, and etching back the second resist until the top surface of the refractory metal electrode is exposed; after removal of the insulating film, using the second resist and the refractory metal electrode as masks, etching the compound semiconductor body; depositing a metal film on a region of the compound semiconductor body including the second resist and the refractory metal electrode; and after removal of the second resist, depositing an insulating film over the entire surface of the compound semiconductor body including the refractory metal electrode and the metal film. Therefore, a mesa-shaped emitter structure is formed self-alignedly with the refractory metal electrode serving as an emitter electrode. In addition, since the above-described method does not includes the etchback step using RIE to form the SiO$_2$ side walls that is employed in the prior art method, the substrate is not damaged or etched due to the etchback. Further, since the method does not include the diagonal ion milling step to remove the base metal, degradation and variation in the characteristics of the HBT are suppressed.

BRIEF DESCRIPTION OF THE PREFERRED EMBODIMENTS

FIGS. 1(a) and (b) are sectional views illustrating an FET including a refractory metal gate electrode with a flat top surface and an FET including a refractory metal gate electrode with an arched top surface, respectively, in accordance with a first embodiment of the present invention.

FIGS. 2(a)–2(p) are sectional views illustrating process steps in a method for fabricating the FET shown in FIG. 1(a).

FIGS. 3(a)–3(l) are sectional views illustrating process steps in a method for fabricating the FET shown in FIG. 1(b).

FIG. 4 is a sectional view illustrating an FET in accordance with a second embodiment of the present invention.

FIGS. 5(a)–5(d) are sectional views illustrating process steps in a method for fabricating the FET shown in FIG. 4.

FIG. 6 is a sectional view illustrating an FET in accordance with a third embodiment of the present invention.

FIGS. 7(a)–7(g) are sectional views illustrating process steps in a method for fabricating the FET shown in FIG. 6.

FIG. 8 is a sectional view illustrating an FET in accordance with a fourth embodiment of the present invention.

FIGS. 9(a)–9(d) are sectional views illustrating process steps in a method for fabricating the FET shown in FIG. 8.

FIG. 10 is a sectional view illustrating an FET in accordance with a fifth embodiment of the present invention.

FIGS. 11(a)–11(g) are sectional views illustrating process steps in a method for fabricating the FET shown in FIG. 10.

FIGS. 12(a) and 12(b) are sectional views illustrating an FET including an n/n+ laminated active layer and an FET including an ion-implanted active layer, respectively, in accordance with a sixth embodiment of the present invention.

FIGS. 13(a)–13(d) are sectional views illustrating process steps in a method for fabricating the FET shown in FIG. 12(a).

FIGS. 14(a)–14(d) are sectional views illustrating process steps in a method for fabricating the FET shown in FIG. 12(b).

FIG. 15 is a sectional view illustrating an FET in accordance with a seventh embodiment of the present invention.

FIGS. 16(a)–16(i) are sectional views illustrating process steps in a method for fabricating the FET shown in FIG. 15.

FIG. 17 is a sectional view illustrating an FET in accordance with an eighth embodiment of the present invention.

FIGS. 18(a)–18(b) are sectional views illustrating process steps in a method for fabricating the FET shown in FIG. 17.

FIGS. 19(a)–19(k) are sectional views illustrating process steps in a method for fabricating an HBT in accordance with a ninth embodiment of the present invention.

FIGS. 25(a) and 25(b) are sectional views illustrating a planar LDD-FET and a planar BPLDD-FET, respectively, according to the prior art.

FIGS. 26(a)–26(g) are sectional views illustrating process steps in a method for fabricating the planar LDD-FET shown in FIG. 25(a).

Figure 27:
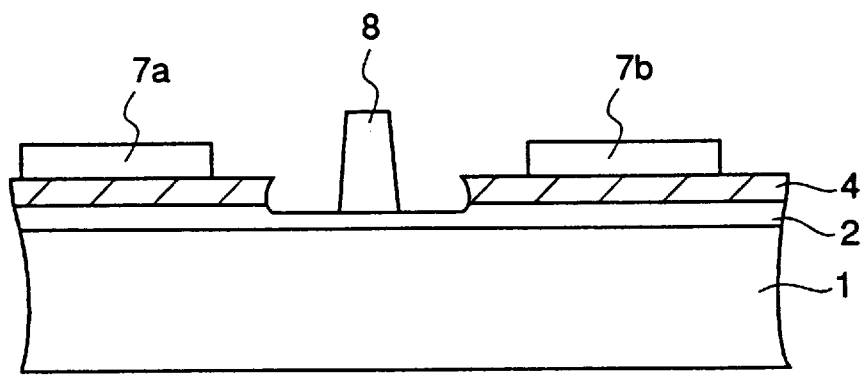

FIG. 27 is a sectional view illustrating a recessed gate FET according to the prior art.

FIGS. 28(a)–28(c) are sectional views illustrating process steps in a method for fabricating the recessed gate FET shown in FIG. 27.

Figure 29:
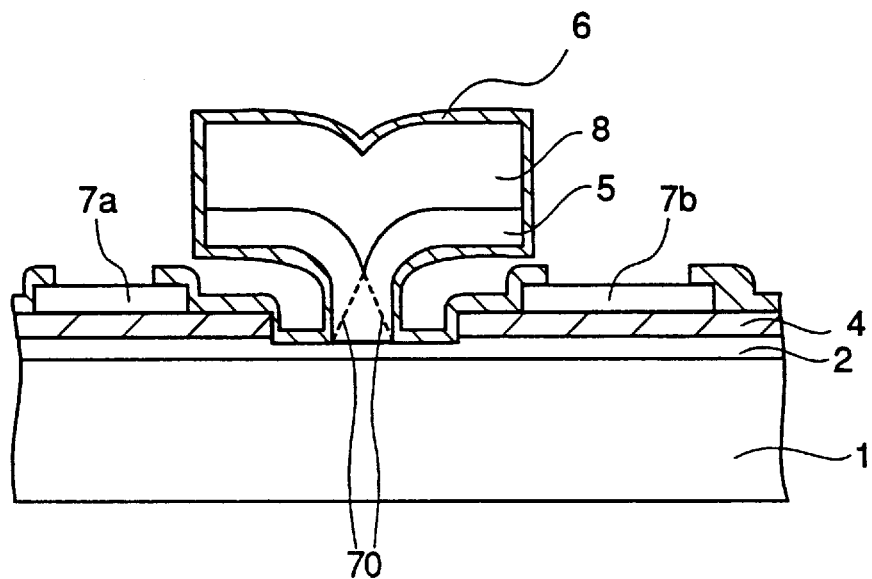

FIG. 29 is a sectional view illustrating a recessed gate FET employing a refractory metal/low-resistance metal double-layer structure gate according to the prior art.

FIGS. 30(a)–30(h) are sectional views illustrating process steps in a method for fabricating the FET shown in FIG. 29.

FIG. 31 is a sectional view illustrating an FET combining an LDD structure and a recessed gate structure according to the prior art.

FIGS. 32(a)–32(h) are sectional views illustrating process steps in a method for fabricating the FET shown in FIG. 31.

Figure 33:
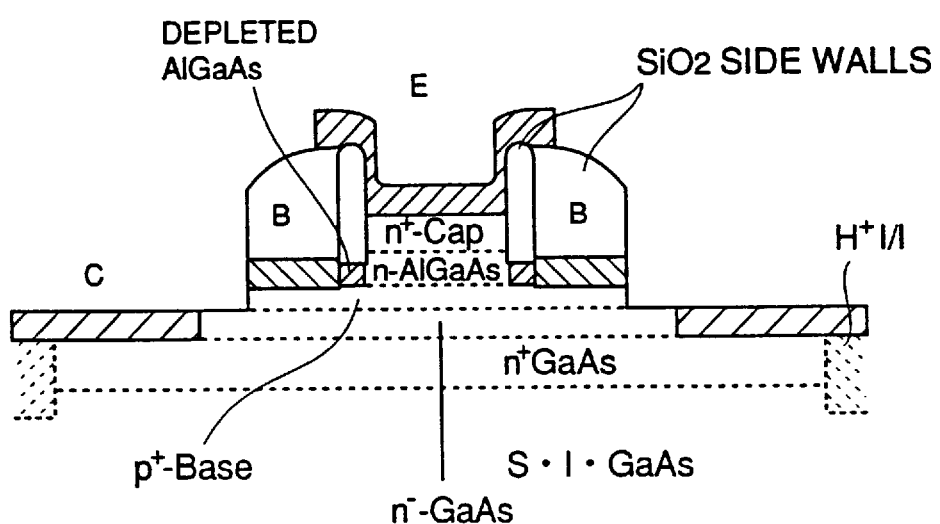

FIG. 33 is a sectional view illustrating an HBT according to the prior art.

FIGS. 34(a)–34(i) are sectional views illustrating process steps in a method for fabricating the HBT shown in FIG. 33.

DETAILED DESCRIPTION OF THE PREFERRED EMBODIMENTS

[Embodiment 1]

Figure 1:
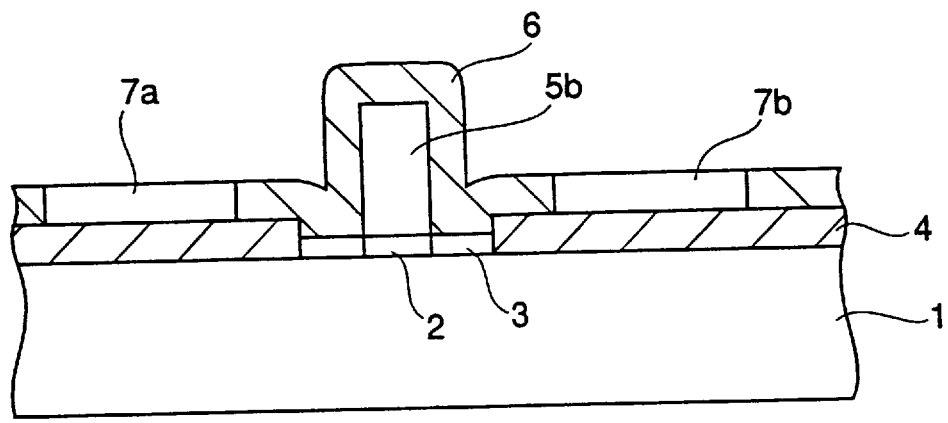
Figure 1:
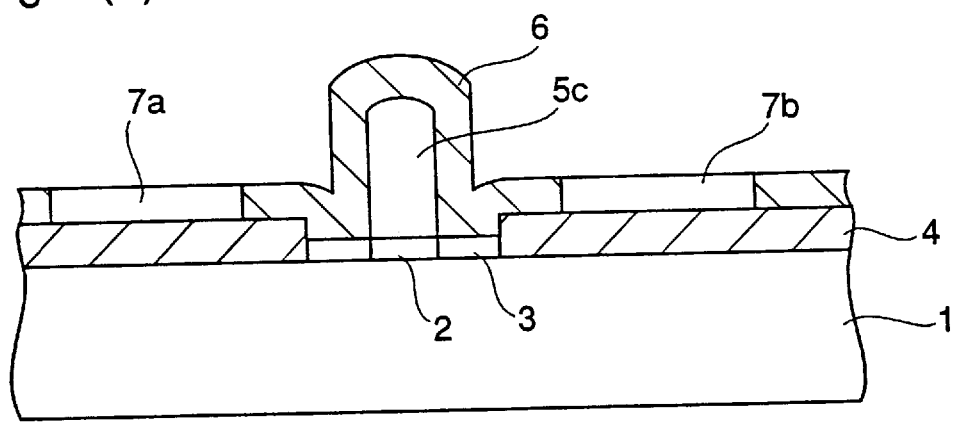

FIGS. 1(a) and 1(b) are sectional views illustrating FETs in accordance with a first embodiment of the present invention. In these figures, the same reference numerals as in FIG. 31 designate the same or corresponding parts. The refractory metal gate electrode 5b is located in the center of the recess, i.e., it is spaced apart from the n+ layers 4 by the same distance with respect to its right and left sides. The n layer 2 is present only under the refractory metal gate electrode 5b, and the n' layers 3 are present within the recess at the both sides of the n layer 2. The n+ layers 4 are present outside the recess and are thicker than the n layer 2 and the n' layers 3. The top of the refractory metal gate electrode 5b is flat as shown in FIG. 1(a) or arched as shown in FIG. 1(b). The refractory metal gate electrode 5b with the flat or arched top surface is clearly different from the prior art refractory metal gate electrode 5a having a V-shaped hollow at the top surface shown in FIG. 29, and the refractory metal gate electrode 5b does not include a void.

Therefore, in an FET structure shown in FIG. 10, which will be described later in more detail, when a low resistance metal film is formed on the refractory metal gate electrode 5b, abnormal diffusion of the low resistance metal into the refractory metal during transistor operation is avoided, thereby improving reliability. In addition, when the low resistance metal layer is produced self-alignedly with the refractory metal electrode, the capacitance of the gate electrode is reduced.

Figure 2:
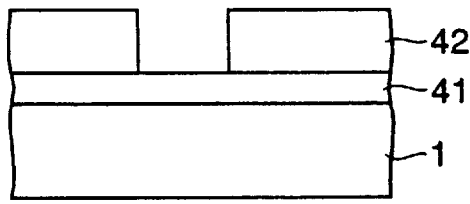
Figure 2:
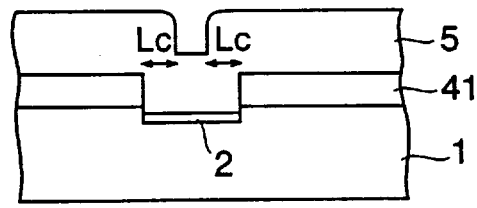
Figure 2:
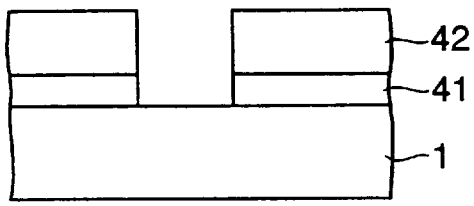
Figure 2:
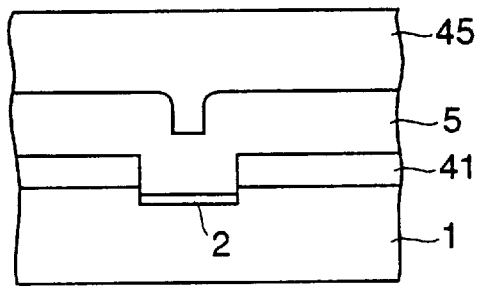
Figure 2:
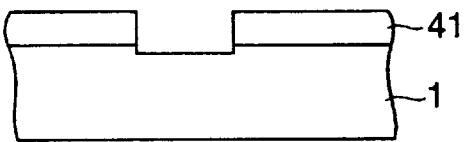
Figure 2:
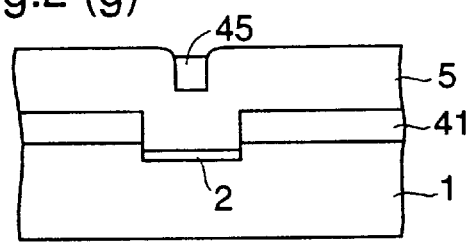
Figure 2:
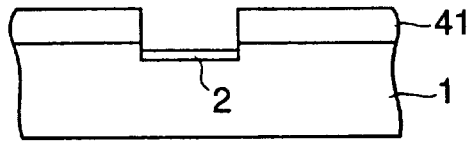
Figure 2:
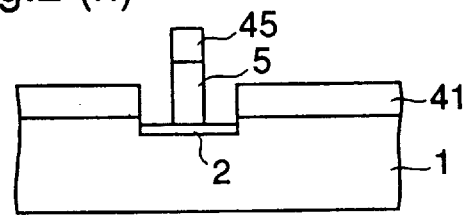
Figure 2:
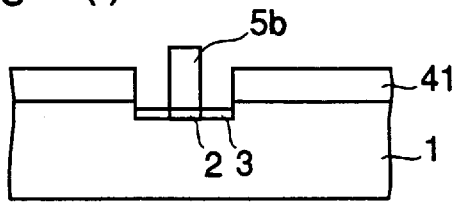
Figure 2:
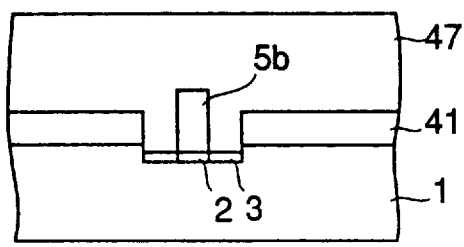
Figure 2:
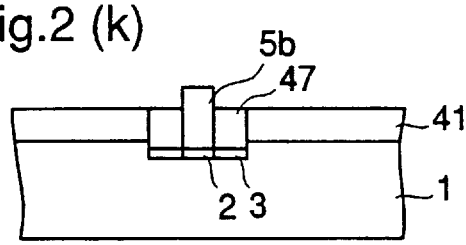
Figure 2:
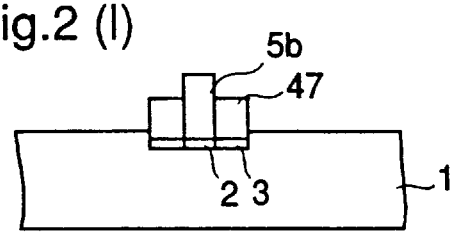
Figure 2:
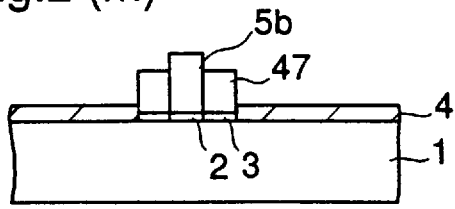
Figure 2:
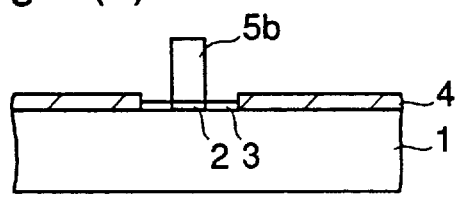
Figure 2:
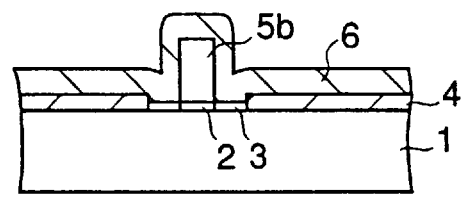
Figure 2:
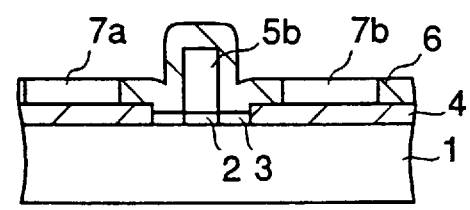

A method of fabricating the FET structure with the flat-top gate electrode shown in FIG. 1(a) is illustrated in FIGS. 2(a)–2(p).

Initially, as illustrated in FIG. 2(a), an insulating film 41 is deposited on the compound semiconductor substrate 1 to a thickness of about 300 nm, and a resist film 42 having a prescribed opening pattern is formed on the insulating film 41. Thereafter, as illustrated in FIG. 2(b), using the resist film 42 as a mask, the insulating film 41 is etched to form an opening. Preferably, the insulating film 41 is $SiO_2$, and the etching technique is RIE which is excellent in vertical etching.

In the step of FIG. 2(c), after removal of the resist film 42, a recess about 100 nm deep is formed in the compound semiconductor substrate 1 by etching. The recess etching may be carried out before the removal of the resist 42. When a recess is formed in a compound semiconductor substrate, wet etching using a mixture of tartaric acid and hydrogen peroxide (50:1) or dry etching using $Cl_2$ is employed. In case of wet etching, since the compound semiconductor substrate 1 is isotropically etched, the profile of ion implantation for producing n+ layers will be changed a little as described later. The vertical recess shown in FIG. 2(c) is achieved by dry etching.

In the step of FIG. 2(d), using the insulating film 41 as a mask, n type-producing dopant ions are implanted into the compound semiconductor substrate 1 at the bottom of the recess, forming an n layer 2. Although the dopant ions are also implanted into the insulating film 41, since the concentration is as low as $10^{17}$ $cm^{-3}$, the composition of the insulating film 41 is hardly changed due to the dopant ions.

In this first embodiment of the invention, Si ions are implanted at an accelerating energy of 60 keV and a dose of about $7\times10^{12}$ cm$^{-2}$. Since the implanted depth is about 100 nm, a 300 nm thick SiO$_2$ film 41 is adequate as a mask for ion implantation.

In the step of FIG. 2(e), a refractory metal film 5, such as WSi, WSiN, WN, or TiW, is deposited over the entire surface so that it is not disconnected at edges of the insulating film 41 adjacent to the recess (hereinafter referred to as step parts). The coverage of the refractory metal film 5 on the step parts determines the width of the n' layers 3 which are later produced. When blanket CVD or CVD using a gas mixture of WF$_6$ and SiH$_4$ is employed, the refractory metal film 5 is deposited with good coverage on the step parts. The CVD process is controlled so that the width $L_C$ of the refractory metal film 5 adjacent to each step part is about 0.25 $\mu$m. Since the thickness $L_C$ depends on the thickness of the refractory metal film 5 on the flat surface of the insulating film 41, the width of the n' layers 3 which are later produced and the gate length can be changed according to the thickness of the refractory metal film 5. Assuming that the opening width $L_{re}$ of the recess is 1.0 $\mu$m, the gate length L is calculated as follows:

$$\begin{aligned} L_g &= L_{re} - 2L_C \\ &= 1.0 - 2 \times 0.25 \\ &= 0.5\ (\mu m) \end{aligned}$$

Further, the surface of the refractory metal film 5 deposited on the bottom of the recess is smooth and flat.

In the step of FIG. 2(f), a first resist 45 is deposited over the entire surface to a thickness sufficient to make the uneven surface, i.e., the hollow space, of the refractory metal film 5 flat. Preferably, the thickness of the first resist 45 is about 1 $\mu$m. Since the first resist 45 is used as a mask for RIE, a novolak resist that is resistant to RIE is employed. Thereafter, as illustrated in FIG. 2(g), the first resist 45 is etched using an etching technique that provides a high uniformity across a wafer, such as O$_2$ ashing. The etching is stopped when the refractory metal film 5 is exposed. As a result of the etching, the hollow space of the refractory metal film 5 is filled with the first resist 45. Since the ratio of the area of the hollow space of the refractory metal film 5 to the area of the entire wafer is very small, in order to leave the resist 45 in the hollow space with high reliability, light emission from CO is observed during the etching and the etching is stopped when the light emission from CO suddenly drops, i.e., when the refractory metal film is exposed. In addition, when the total of the thickness of the insulating film 41 and the depth of the recess is large, the resist 45 is reliably left in hollow space. In this first embodiment, the total is about 400 nm, and it is quite enough. Further, reliability depends on the width of the recess. When the recess is too wide, it is difficult to leave the resist 45 in the hollow space. In this first embodiment, the recess width must not exceed 2.0 $\mu$m.

In the step of FIG. 2(h), using the resist 45 as a mask, the refractory metal film 5 is etched. Preferably, an etching technique that hardly damages or etches the n layer 2, such as plasma etching or ECR (Electron Cyclotron Resonance) etching, is employed. As an etching gas, SF$_6$ or a mixture of CF$_4$ and O$_2$ is employed. The etching is stopped when the insulating film 41 is exposed. The end point of the etching is easily detected when light emission from F radicals or light emission from SiF is observed. Although the thickness of the refractory metal film 5 covering the steps of the insulating film 41, i.e., the thickness from the bottom of the recess, is larger than the thickness of the refractory metal film 5 on the flat surface of the insulating film 41, the refractory metal film 5 covering the steps is completely etched when the etching of the refractory metal film 5 on the flat surface of the insulating film 41 is concluded. The reason is as follows. As described above, the refractory metal film 5 is easily disconnected at the step part, so that a very poor-quality film, i.e., a porous film, is deposited on the step part. Therefore, the etching rate of the refractory metal film 5 is higher on the step part than on the flat surface of the insulating film 41, so that the refractory metal film on the step part is completely etched away by the time that on the flat surface is etched away. As a result of the etching, a refractory metal gate electrode 5b is produced. The gate length $L_g$ is obtained from the above-described equation, i.e., $L_g=L_{re}-2L_C$, where $L_{re}$ is the opening width of the recess and $L_C$ is the width of the refractory metal film 5 on the step part.

In the step of FIG. 2(i), after removal of the first resist 45, Si ions are implanted to form n' layers 3. Since the depth of the n' layers 3 is desired to be the same as the depth of the n layer 2, the Si ions are implanted at an accelerating energy of 60 keV. The dose depends on the desired breakdown voltage and transconductance. Thereafter, as illustrated in FIG. 2(j), a second resist 47 is deposited over the entire surface. Preferably, a novolak resist is deposited because it is used as a mask for ion implantation. The thickness of the second resist 47 is about 1 $\mu$m.

In the step of FIG. 2(k), the second resist 47 is etched by O$_2$ ashing, and the etching is stopped when the insulating film 41 is exposed. The principle and the method for detecting the end point of the etching are the same as those already described for the etching of the first resist 45. In subsequent ion implantation for making n$^+$ layers, in order to avoid unwanted incorporation of a resist that masks a region of the substrate where the FET is not fabricated into the second resist 47 on the both sides of the refractory metal gate 5b, the second resist 47 must be reformed by deep UV curing.

In the step of FIG. 2(l), the insulating film 41 is removed by wet etching with a mixture of buffered HF and H$_2$O (30:1) so that the refractory metal gate electrode 5, the second resist 47, and the compound semiconductor substrate 1 are not adversely affected by the etching and no residue is left. Thereafter, as illustrated in FIG. 2(m), using the refractory metal gate 5b and the resist film 47 as masks, Si ions are implanted to form n$^+$ layers 4. A region of the substrate where the FET is not fabricated is masked with a resist although the resist is not shown in FIG. 2(m). The ion implantation is carried out at an accelerating energy lower than 140 keV so that the depth of the n$^+$ layers does not exceed 200 nm, the sum of the depth of the recess (100 nm) and the depth of the n and n' layers (100 nm). The dose is about $5\times10^{13}$ cm$^{-2}$. Although it is not always necessary to level the bottom of the n$^+$ layers 4 with the bottoms of the n layer 2 and the n' layers 3, the depth of the n$^+$ layers 4 must be sufficient to suppress the short channel effect and increase the transconductance.

After removal of the second resist 47 (FIG. 2(n)), the ion-implanted layers are activated by annealing. This annealing is carried out at about 800° C., in an As atmosphere for about 30 min. Then, as illustrated in FIG. 2(o), an insulating film 6 for passivation is deposited. Preferably, the insulating film 6 has a stress lower than $1\times10^9$ dyn/cm$^2$ to suppress the short channel effect. For example, an SiON film is deposited by plasma CVD.

Finally, the insulating film 6 is etched using a resist mask (not shown) having openings opposite regions where source and drain electrodes are later fabricated, and ohmic metals are deposited and lifted off to form source and drain electrodes 7a and 7b, followed by sintering, whereby an FET shown in FIG. 2(p) is completed. The source and drain electrodes 7a and 7b comprise AuGe based alloy including Ni as a lowermost metal that reduces the contact resistance. The upper surface of the refractory metal gate electrode 5b of the completed FET shown in FIG. 2(p) is smooth and flat.

While in the above-described fabricating method CVD is employed as a method for depositing the refractory metal film 5, sputtering may be employed in place of CVD. The fabricating method including the sputtering of the refractory metal film 5 is illustrated in FIGS. 3(a)–3(l).

Figure 3:
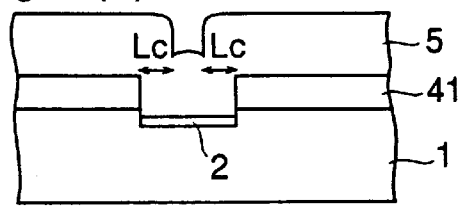
Figure 3:
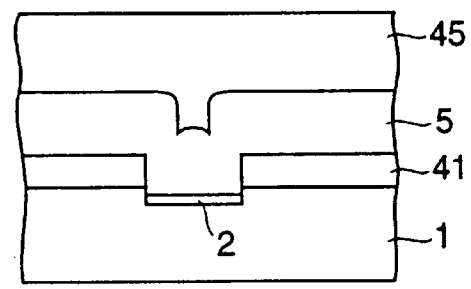
Figure 3:
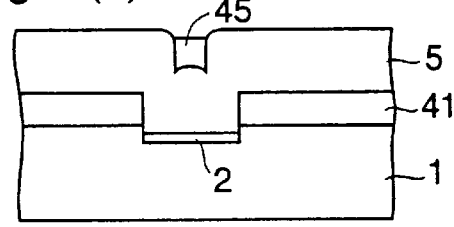
Figure 3:
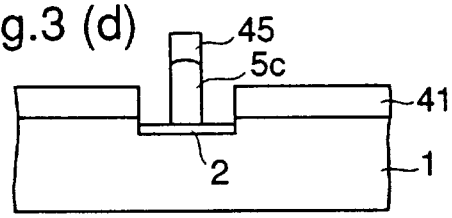
Figure 3:
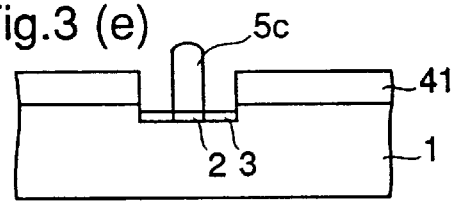
Figure 3:
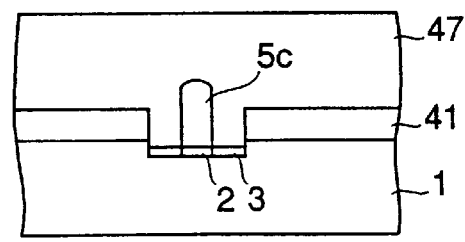
Figure 3:
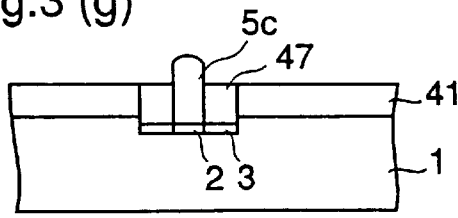
Figure 3:
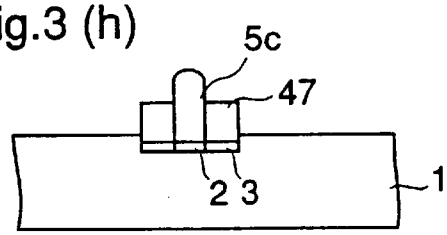
Figure 3:
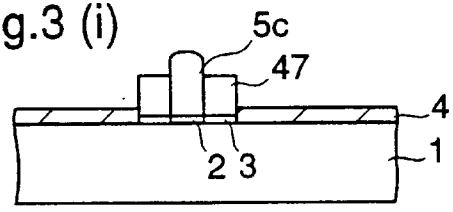
Figure 3:
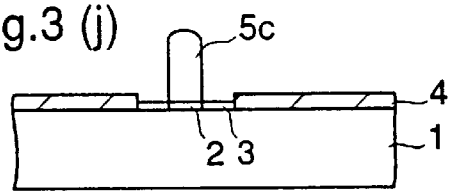
Figure 3:
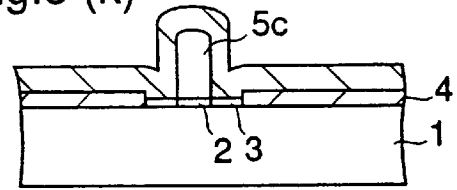
Figure 3:
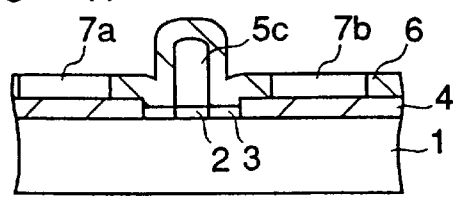

The process steps until the ion implantation for forming the n layer 2 are identical to those already described with respect to FIGS. 2(a)–2(d). After the formation of the n layer 2, as shown in FIG. 3(a), a refractory metal film 5, such as WSi, WSiN, WN, or TiW, is deposited over the entire surface using sputtering. The metal film 5 is deposited to a thickness exceeding 600 nm, that, sufficient to avoid an unwanted discontinuity of the metal film 5 at the edge of the opening of the recess. In this case, the width $L_C$ of the refractory metal film 5 covering the step part is about 0.25 $\mu$m. In addition, when the opening width of the recess $L_{re}$ is 1.0 $\mu$m, a gate length $L_g$ of 0.5 $\mu$m is realized as in the case where the refractory metal film is deposited by CVD. The upper surface of the refractory metal film 5 deposited on the bottom of the recess is smooth and arched. Thereafter, a first resist 45 is deposited over the entire surface as shown in FIG. 3(b). The process steps after the deposition of the first resist 45, i.e., process steps shown in FIGS. 3(c)–3(l), are identical to those already described with respect to FIGS. 2(g)–2(p). In the completed FET shown in FIG. 3(l), the upper surface of the refractory metal gate electrode 5c is smooth and arched.

While in the above-described fabricating methods according to the first embodiment of the invention the $n^+$ layers 4 are formed after the formation of the n' layers 3, the $n^+$ layers 4 may be formed before the formation of the n' layers 3. Also in this case, the same FET as shown in FIG. 2(p) or 3(l) is fabricated.

A description is given of the advantages of the FET fabricated as described above.

First, since the gate electrode 5b (5c) comprises a refractory metal, the lifetime of the FET is increased. The reason is as follows. That is, since the Schottky contact between the refractory metal, such as WSi, WSiN, WN, or TiW, and GaAs is reliable at a relatively high temperature, exceeding 600° C., the height of the Schottky barrier $\phi_B$ and the ideality factor (n) that determines I–V characteristics at the Schottky contact are not degraded. During high-power output operation of an FET, since the channel temperature and the Schottky contact temperature exceed 100° C., the heat resistance of the Schottky contact must be high to lengthen the lifetime of the FET. On the other hand, a Schottky contact between Au or Al and GaAs results in degradations of the $\phi_B$ and the ideality factor at a relatively low temperature, 350°–400° C. Therefore, when an FET including a gate electrode comprising Au or Al is operated at high-power output and the channel temperature and the Schottky contact temperature exceed 100° C., the Schottky contact rapidly degrades.

Figure 20:
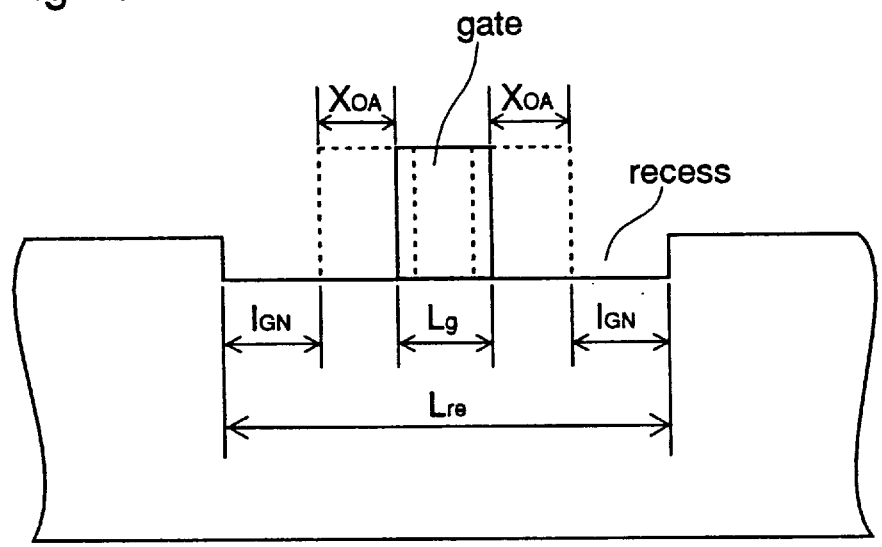
FIG. 20 is a schematic diagram for explaining a relationship between alignment precision and recess width when a refractory metal gate electrode is produced in the recess using a reduced projection exposure apparatus.

Secondly, since the gate electrode, the recess, and the active layers are arranged self-alignedly, the reproducibility of the FET structure is improved. For example, the pinch-off voltage $V_p$ or the threshold voltage $V_{th}$ and the saturation current are reproduced at good yield. When a gate electrode is produced in a recess not self-alignedly but using reduced projection exposure, it is necessary to allow a margin for alignment precision. Since the alignment precision $X_{OA}$ in reduced projection exposure is about 0.25 $\mu$m, the gate electrode in the recess is dislocated by 0.5 $\mu$m at the maximum. That is, as shown in FIG. 20, when the gate length $L_g$ is 0.3 $\mu$m and the gate to recess edge distance $l_{GN}$ is more than 0.3 $\mu$m, the design recess width $L_{re}$ must be set not to 0.9 $\mu$m but to 1.4 $\mu$m (0.9+0.5) or more. When the recess width $L_{re}$ is increased by that margin, the gate to recess edge distance $l_{GN}$ is increased, resulting in reduction in the transconductance, poor reproducibility of the breakdown voltage, and poor controllability of the pinch-off voltage $V_p$ or the threshold voltage $V_{th}$. The prior art FET fabricated by the method shown in FIGS. 32(a)–32(h) in which the LDD structure and the recessed gate structure are combined has the above-described drawbacks.

Figure 21:
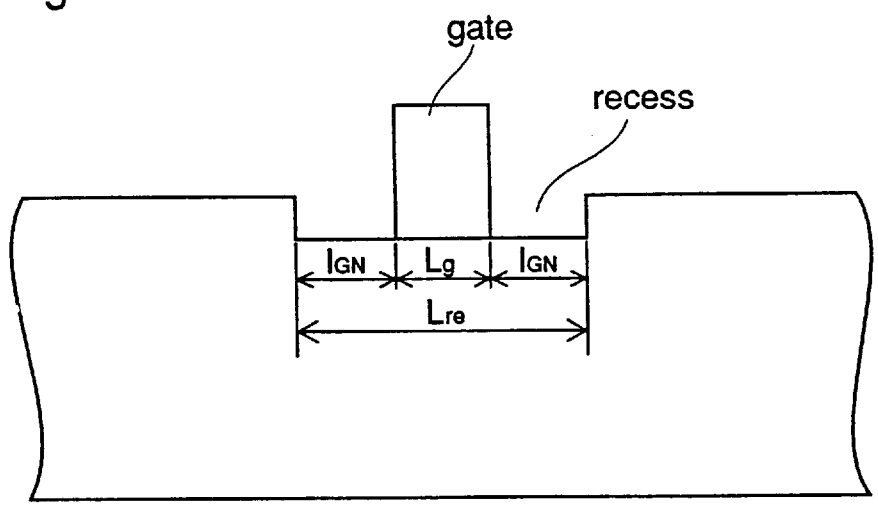
FIG. 21 is a schematic diagram for explaining recess width when a refractory metal gate electrode is self-alignedly produced in the recess.

Contrary to the prior art FET, in the FET according to the first embodiment of the invention, since the gate electrode and the active layers are produced self-alignedly with the recess, it is not necessary to leave a margin of alignment precision for the gate length $L_g$ and the gate to recess edge distance $l_{GN}$, so that the recess width $L_{re}$ can be set to 0.9 $\mu$m as shown in FIG. 21. That is, in the FET fabricated using the self-alignment process according to the present invention, the reproducibilities of the transconductance and the breakdown voltage and the controllability of the pinch-off voltage $V_p$ or the threshold voltage $V_{th}$ are significantly improved as compared to the prior art FET fabricated by the method illustrated in FIGS. 32(a)–32(h). Further, since the active layers are controlled by ion implantation, the reproducibility of the FET structure is easily maintained as compared to the prior art recessed gate FETs fabricated by the methods shown in FIGS. 28(a)–28(c) and FIGS. 30(a)–30(h).

Figure 22:
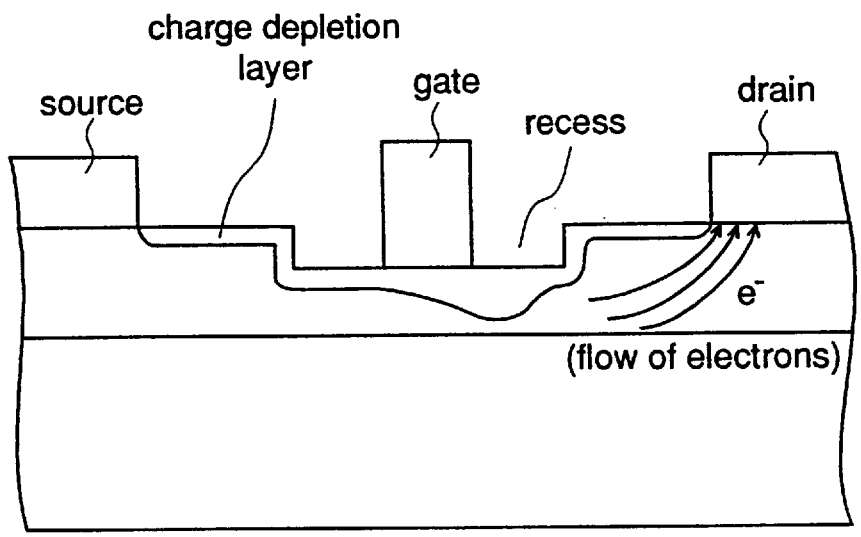
FIG. 22(a) is a schematic diagram illustrating flow of electrons in an active layer of a recessed gate FET and FIG. 22(b) is a schematic diagram illustrating flow of electrons in an active layer of a planar FET.
Figure 22:
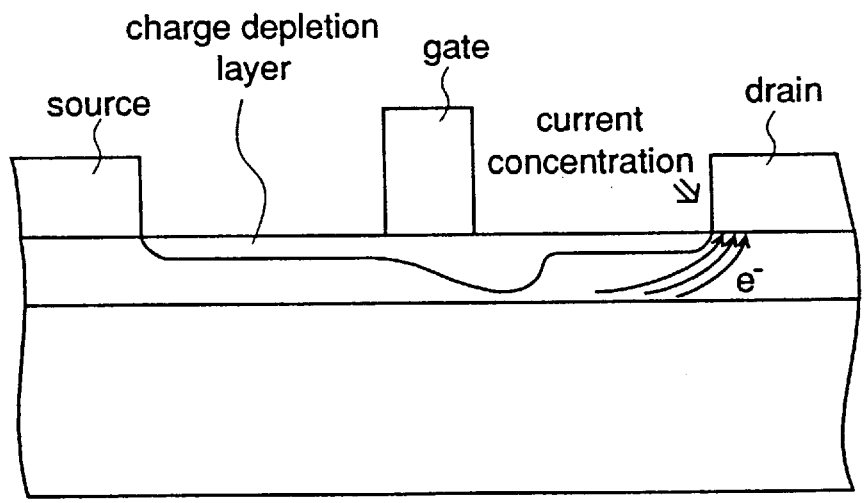

Third, since the recessed gate structure is employed, the drain breakdown voltage of the FET is increased. More specifically, in the recessed gate FET, as shown in FIG. 22(a), current flows through the channel region inside the substrate, whereas current flows through the surface region of the substrate in the planar FET shown in FIG. 22(b). Therefore, in the planar FET shown in FIG. 22(b), current flowing toward the drain is concentrated at the drain edge. On the other hand, in the recessed gate FET shown in FIG. 22(a), current flows deeply inside the substrate and reaches the drain, so that current concentration is suppressed. Further, since the recessed gate FET according to the present invention is hardly affected by the surface depletion layer produced at the surface of the compound semiconductor substrate, the parasitic resistance is reduced and the saturation current is increased. As a result, the drain breakdown voltage of the FET is increased.

Embodiment 2.

Figure 4:
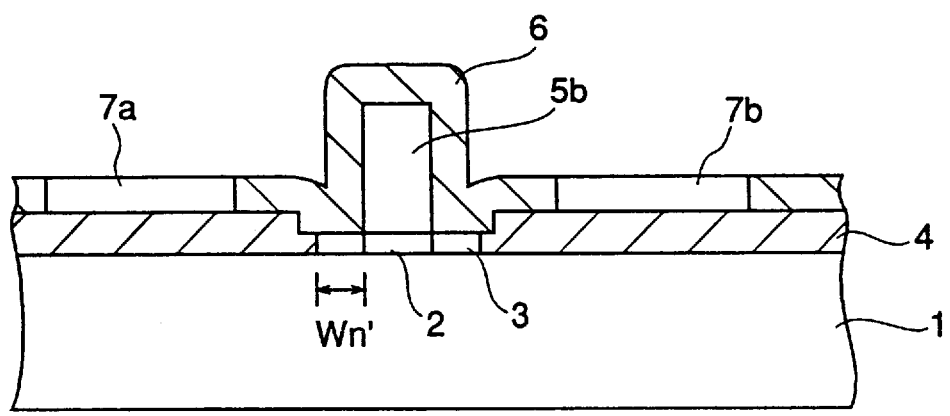

While in the above-described first embodiment of the invention the $n^+$ layers 4 are located outside the recess, portions of the $n^+$ layers 4 may be disposed under the recess as shown in FIG. 4. In FIG. 4, the n' layers 3 are located symmetrically with respect to the refractory metal gate electrode 5b and have the same width $W_{n'}$.

Figure 5:
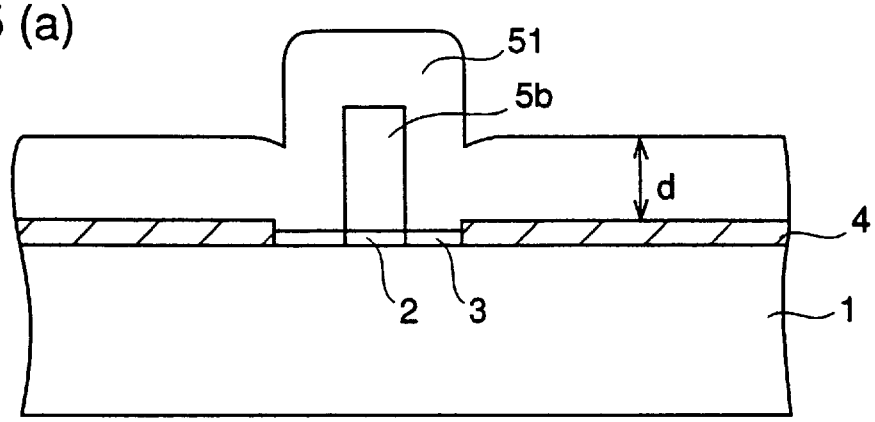
Figure 5:
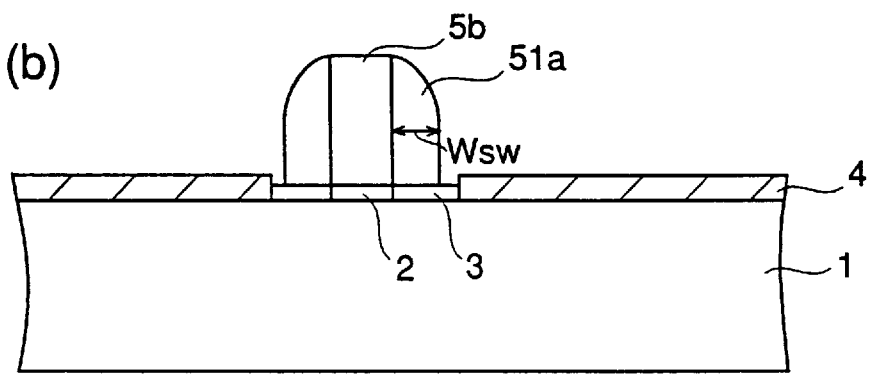
Figure 5:
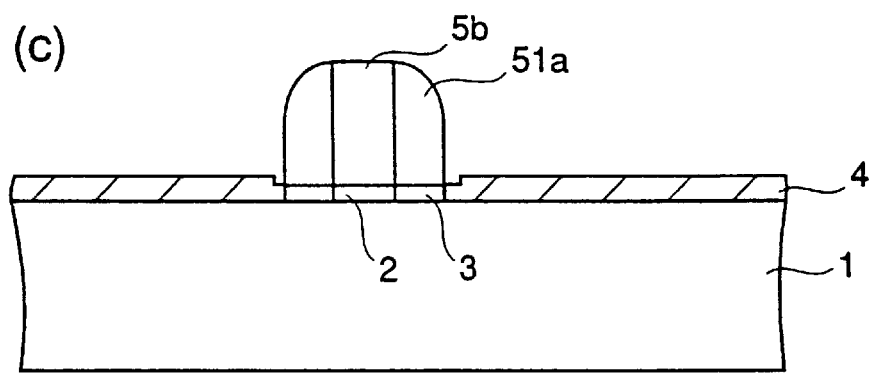
Figure 5:
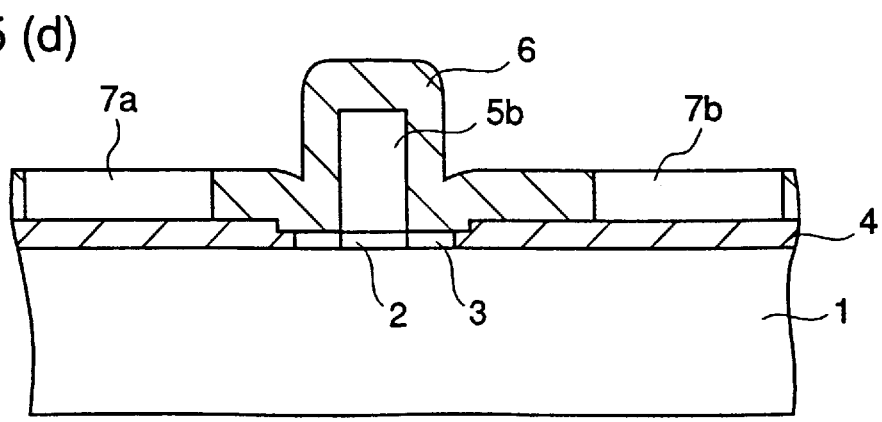

FIGS. 5(a)–5(d) are sectional views illustrating process steps in a method of fabricating the FET structure shown in FIG. 4. The process steps until the formation of the $n^+$ layers 4 are identical to those already described with respect to FIGS. 2(a)–2(n). After the formation of the $n^+$ layers 4, as illustrated in FIG. 5(a), an insulating film 51, such as $SiO_2$, is deposited to a thickness of about 300 nm, preferably by plasma CVD. Thereafter, as illustrated in FIG. 5(b), the $SiO_2$ film 51 is etched, leaving portions 51a on the both sides of the refractory metal gate electrode 5b. Hereinafter, these portions 51a are referred to as insulating side walls. The width $W_{SW}$ of the insulating side wall 51a depends on the thickness d of the insulating film, and the width $W_{SW}$ and the thickness d have a relationship of $W_{SW}=(2/3)d$. The insulating side walls 51a do not contact the $n^+$ layers 4 at the edges of the recess. For example, if the distance from the gate to the recess edge is 0.25 μm, the insulating film 51 should be thinner than 375 nm.

In the step of FIG. 5(c), using the insulating side walls 51a as masks, Si ions are implanted so that unmasked portions of the n' layers 3 are changed into $n^+$ type. The depth of the ion implantation is about 100 nm that is equivalent to the depth of the n' layers 3. The accelerating energy is 60 keV as in the ion implantation for the n' layers 3, and the dose is $2\times10^{13}$ $cm^{-2}$. After removal of the insulating side walls 51a, as in the above-described first embodiment, the structure is subjected to annealing for activating the ion-implanted layers, deposition of an insulating film 6, and fabrication of source and drain electrodes 7a and 7b, thereby completing an FET shown in FIG. 5(d).

In an alternative method, in the step of FIG. 2(m) according to the first embodiment, the resist 47 may be etched by $O_2$ ashing to reduce the width of the resist 47 and expose portions of the n' layers 3 and then Si ions are implanted to change the portions of the n' layers 3 into $n^+$ type. Also in this method, the same structure as shown in FIG. 4 is obtained.

Figure 23:
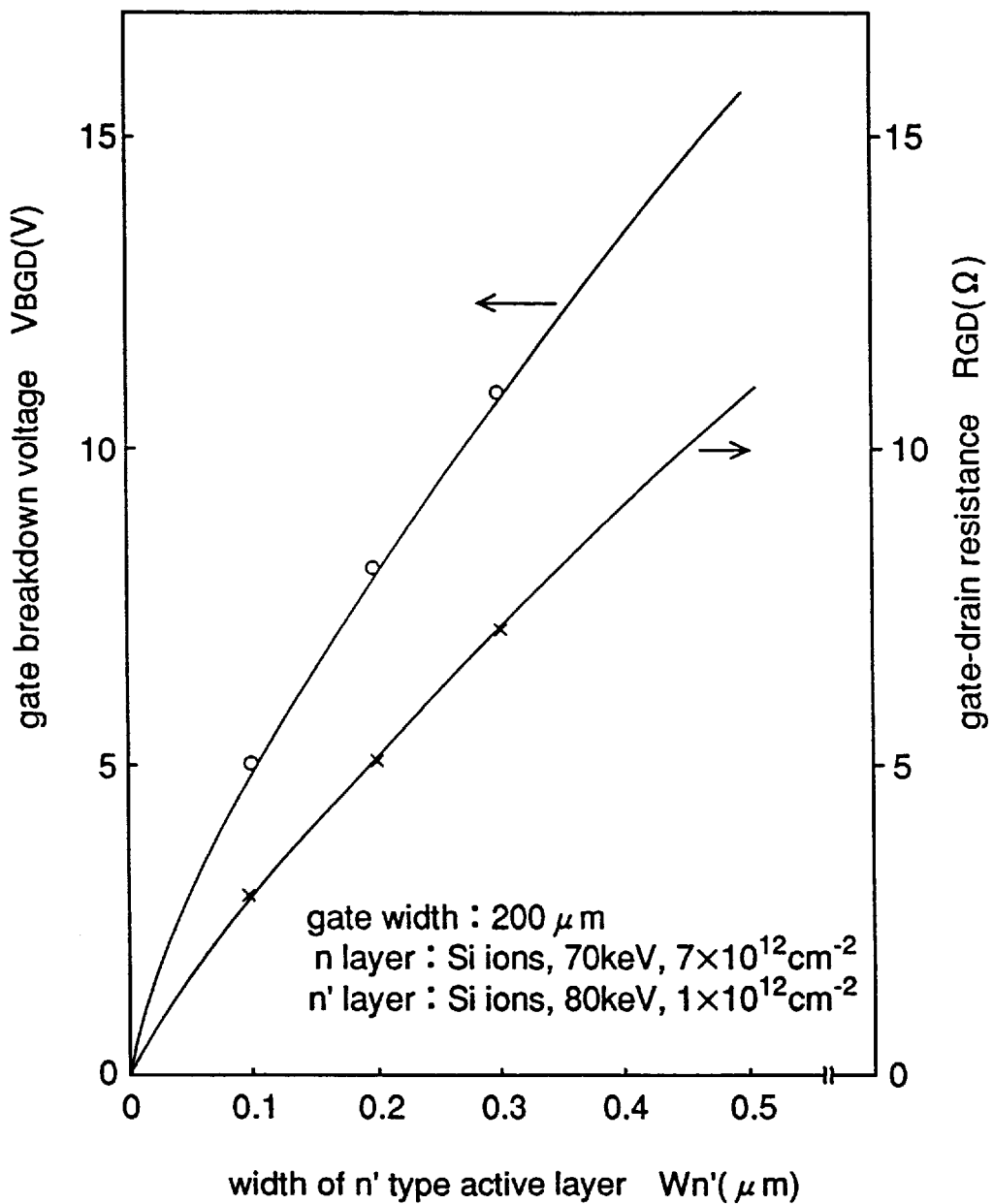
FIG. 23 is a graph for explaining relationships between width of n' layer, gate breakdown voltage, and gate-to-drain resistance.

An advantage of the FET according to this second embodiment over the FET according to the first embodiment resides in that the gate to drain resistance is reduced as a result of the reduced width of the n' layer 3. However, the gate breakdown voltage is lowered. FIG. 23 is a graph illustrating the relationship between the width of the n' layer $W_{n'}$, the gate to drain resistance $R_{GD}$, and the gate breakdown voltage $V_{BGD}$. As shown in FIG. 23, both the gate to drain resistance $R_{GD}$ and the gate breakdown voltage $V_{BGD}$ increase with an increase in the width of the n' layer $W_{n'}$. Therefore, the gate to drain resistance $R_{GD}$ and the width of the n' layer $W_{n'}$ are selected according to the gate breakdown voltage $V_{BGD}$ required for the FET. For example, $V_{BGD}>13$ V in a high-power output amplifier, and $V_{BGD}>8$ V in a low-noise amplifier.

Embodiment 3.

Figure 6:
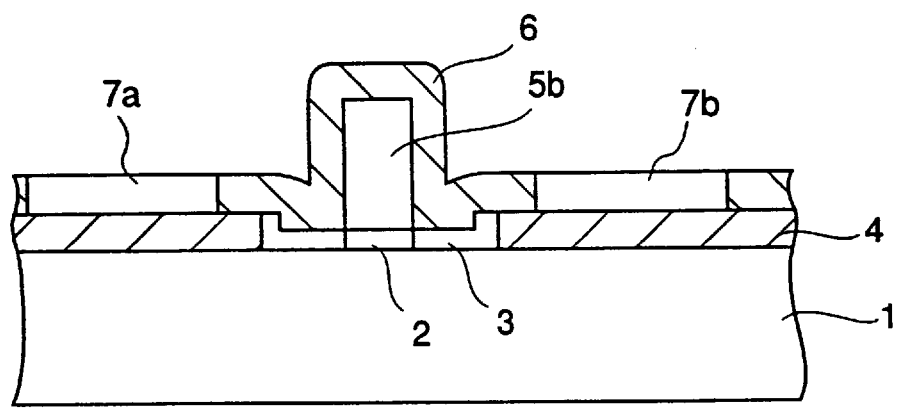

While in the above-described first embodiment the n' layers 3 are located beneath the recess, portions of the n' layers 3 may be disposed outside the recess as shown in FIG. 6. In FIG. 6, the n' layers 3 are located symmetrically with respect to the refractory metal gate electrode 5b and have identical widths.

Figure 7:
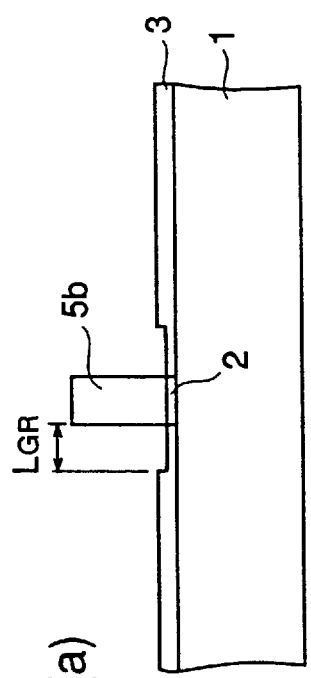
Figure 7:
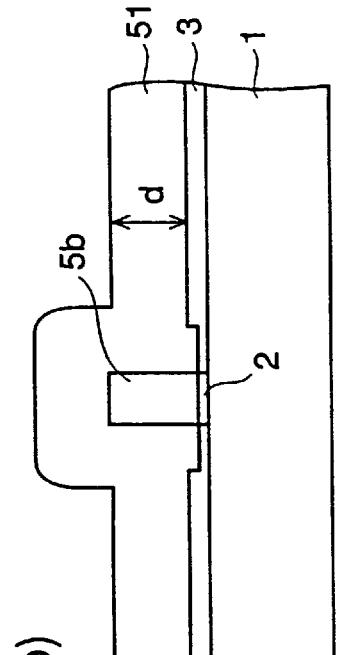
Figure 7:
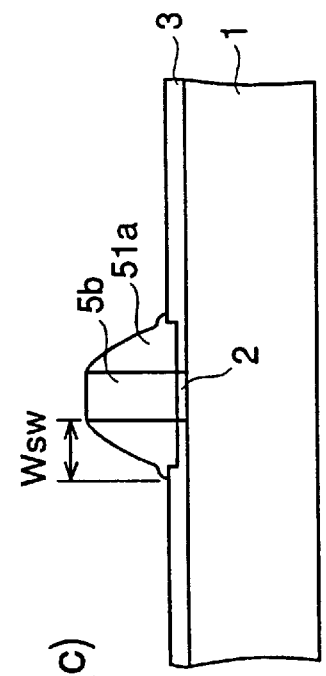
Figure 7:
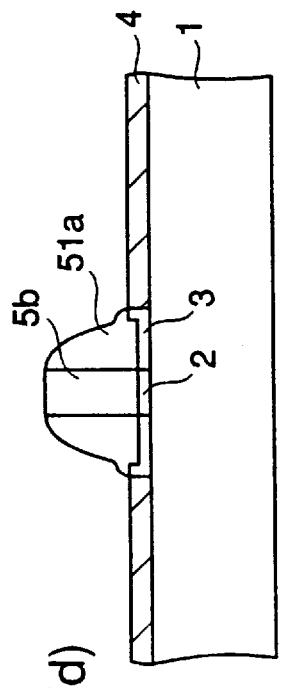
Figure 7:
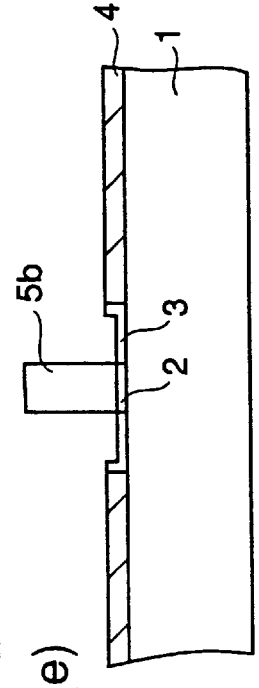
Figure 7:
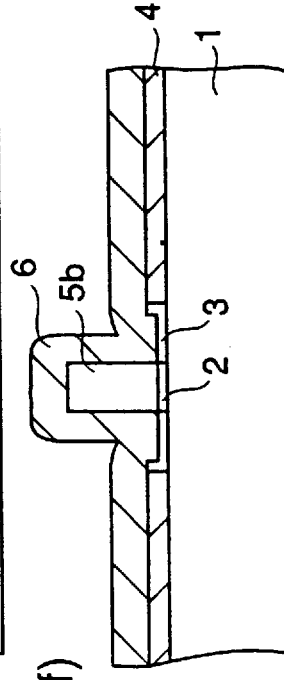
Figure 7:
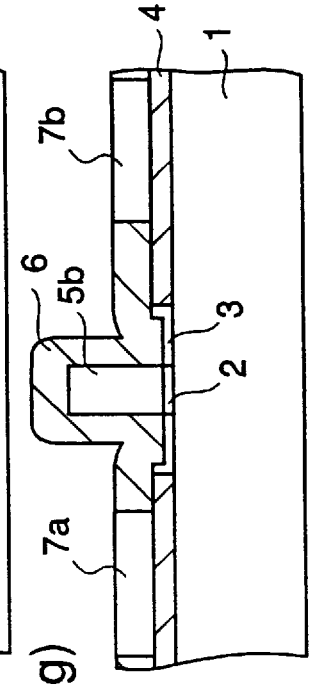

FIGS. 7(a)–7(g) are sectional views illustrating process steps in a method of fabricating the FET structure shown in FIG. 6. The process steps until the step shown in FIG. 7(a) are identical to those already described with respect to FIGS. 2(a)–2(m) except that, in the step of FIG. 2(m), Si ions are implanted at an accelerating energy lower than 140 keV and a dose of $1.4\times10^{13}$ $cm^{-2}$ to produce n' layers in place of the $n^+$ layers 4. Thereafter, the resist 47 is removed as shown in FIG. 7(a). In the step of FIG. 7(b), an insulating film 51 is deposited over the entire surface to a thickness of 450 nm. Then, as illustrated in FIG. 7(c), the insulating film 51 is etched by RIE leaving portions 51a on the both sides of the refractory metal gate electrode 5. Hereinafter, these portions 51a are referred to as insulating side walls. Since the width $W_{SW}$ of the insulating side wall 51a must be larger than the distance $L_{GR}$ from the gate end to the recess end, the thickness d of the insulating film 51 is selected so that the following relationship is satisfied.

$$L_{GR}<(2/3)d=W_{SW}$$

Since the distance $L_{GR}$ is 0.25 μm, the thickness d must be larger than 375 nm. In this embodiment, it is 450 nm as described above.

In the step of FIG. 7(d), using the insulating side walls 51a as masks, Si ions are implanted at an energy of 120–140 keV and a dose of $5\times10^{13}$ $cm^{-2}$, producing $n^+$ layers 4. Thereafter, as illustrated in FIG. 7(e), the insulating side walls 51a are removed with buffered HF, followed by annealing to activate the active layers. Then, an insulating film 6 is deposited as shown in FIG. 7(f). Finally, source and drain electrodes 7 are produced as shown in FIG. 7(g) to complete the FET.

In an alternative method, in the step of FIG. 2(m) according to the first embodiment, n' layers are produced in place of the $n^+$ layers 4, and the resist 47 is deformed by baking so that portions thereof extend over the n' layers at the recess edge, followed by ion implantation using the resist 47 as a mask to form $n^+$ layers 4. Also in this case, the same structure as shown in FIG. 6 is obtained.

In the FET fabricated by the above-described method, since the width $W_{n'}$ of the n' layer 3 is increased, a gate breakdown voltage ($V_{BGD}$) higher than those of the FETs according to the first and second embodiments is achieved, as seen from FIG. 23.

Embodiment 4.

Figure 8:
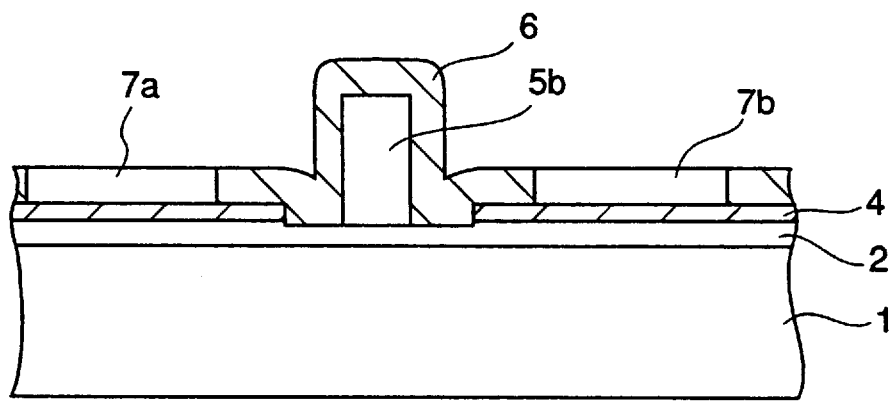

FIG. 8 is a sectional view illustrating an FET in accordance with a fourth embodiment of the present invention. While in the above-described first to third embodiments the n layer 2 is disposed only under the refractory metal gate electrode, in this fourth embodiment the n layer 2 and the $n^+$ layer 4 are successively disposed on the compound semiconductor substrate 1 and the bottom of the recess is present within the n layer 2.

The process steps for fabricating the FET shown in FIG. 8 are illustrated in FIGS. 9(a)–9(d). In advance, a compound semiconductor substrate having an n layer 2 and an $n^+$ layer 4, which are produced by epitaxial growth or implantation of Si ions and annealing, is prepared.

Figure 9:
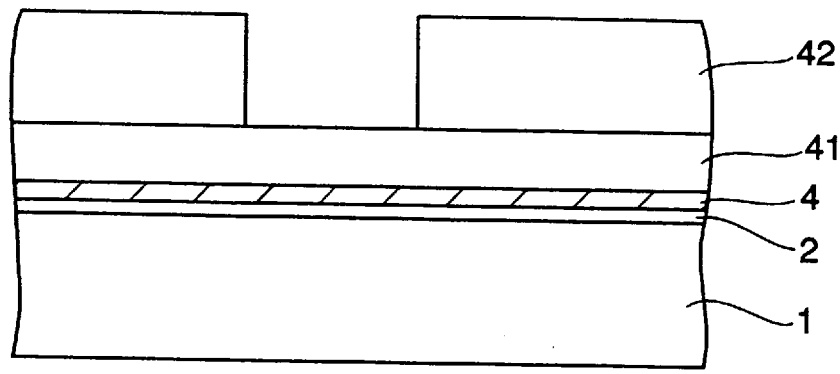
Figure 9:
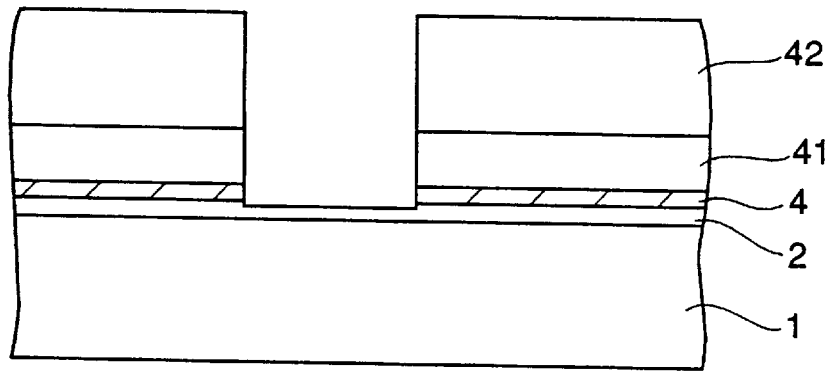
Figure 9:
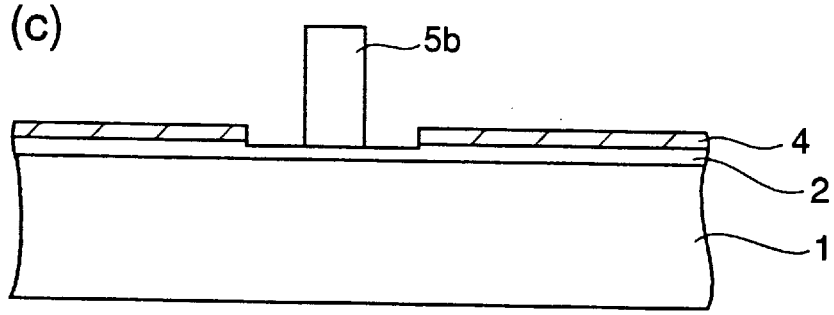
Figure 9:
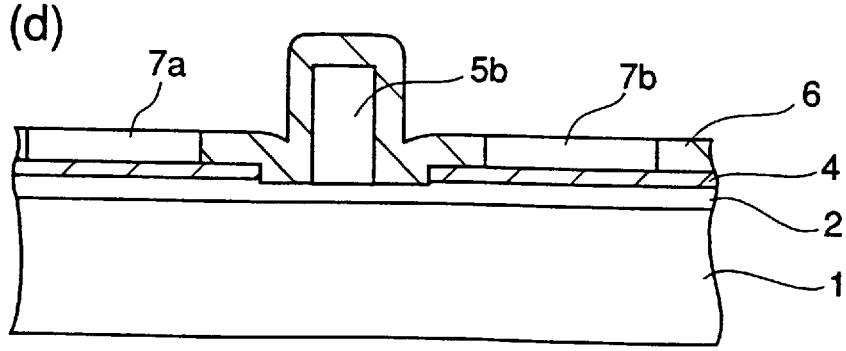

Initially, an insulating film 41 is deposited over the substrate and a resist film 42 having an opening pattern is formed on the insulating film 41 as shown in FIG. 9(a). Using the resist film 42 as a mask, the insulating film 41 is etched to form an opening and, subsequently, the $n^+$ layer 4 and a part of the n layer 2 are etched. In the etching process, the question is where the etching should be stopped. Usually, the following methods are employed for accurately stopping the etching. That is, source and drain electrodes are produced in advance, and the etching is carried out while monitoring current flowing between source and drain electrodes. Alternatively, an intrinsic type (hereinafter referred to as i type) layer is inserted between the n layer 2 and the $n^+$ layer 4, whereby the etching is automatically stopped at the i type layer. In this embodiment, an i type AlGaAs layer is inserted between the n type GaAs layer 2 and the $n^+$ type GaAs layer 4. Thereafter, a refractory metal gate electrode 5b is produced in the recess according to the same process steps as described with respect to FIGS. 2(e)–2(h), resulting in the structure shown in FIG. 9(c). When sputtering is employed for the deposition of the refractory metal film 5, the structure shown in FIG. 9(c) is annealed at about 500° C. to remove damages due to the sputtering. To complete the FET shown in FIG. 9(d), an insulating film 6 is deposited and source and drain electrodes 7a and 7b are produced. In the above-described method, although the annealing for activating the ion-implanted n type and n⁺ layers or the epitaxial growth of the n type and n⁺ layer is carried out at a high temperature, exceeding 600° C., process steps after the formation of those layers are carried out at relatively low temperatures.

In the FET according to the fourth embodiment of the invention, since the n layer 2 and the n⁺ layer 4 are produced before formation of the gate electrode 5b, these layers can be produced by epitaxial growth. In this case, a steep distribution of dopant concentration in the n layer 2 and the n⁺ layer 4, which cannot be obtained by ion implantation, is obtained. The upper limit of carrier concentration in an epitaxial layer is about $5 \times 10^{18}$ cm$^{-3}$ whereas it is about $1 \times 10^{18}$ cm$^{-3}$ in an ion-implanted layer. Therefore, an epitaxially grown n⁺ layer having a carrier concentration higher than that of an ion-implanted n⁺ layer can be employed, resulting in an FET having a transconductance higher than an FET in which active layers are formed by ion implantation. Furthermore, an epitaxial substrate comprising GaAs/i-AlGaAs/n⁺-GaAs that is used for an HEMT (High Electron Mobility Transistor) may be applied to the FET according to this fourth embodiment of the invention.

Embodiment 5.

Figure 10:
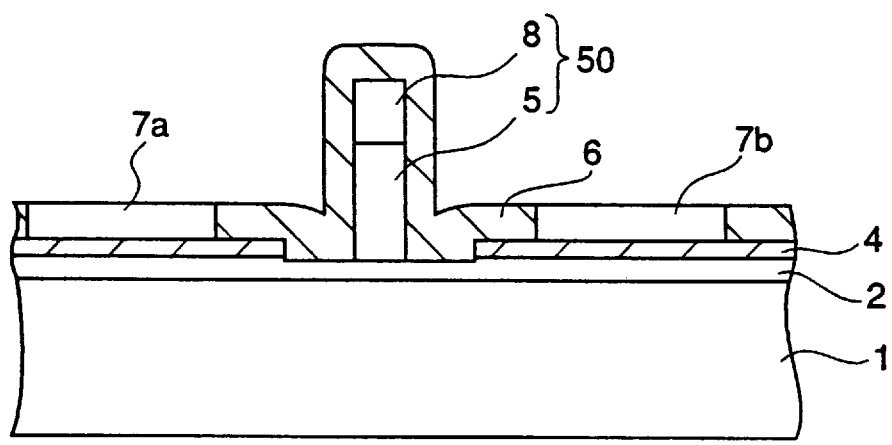

FIG. 10 is a sectional view illustrating an FET in accordance with a fifth embodiment of the present invention. While in the above-described first to fourth embodiments the gate electrode comprises a refractory metal, in this fifth embodiment a gate electrode 50 has a double-layer structure comprising a refractory metal 5 and a low resistance metal 8 which is formed self-alignedly with the refractory metal gate 5.

Figure 11:
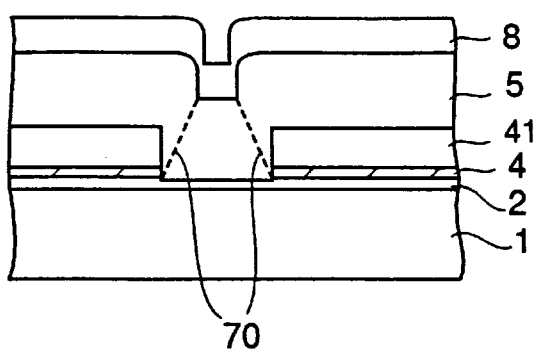
Figure 11:
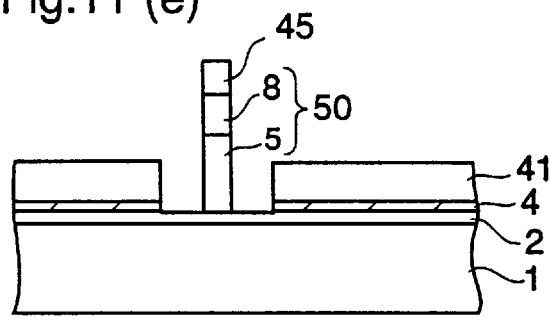
Figure 11:
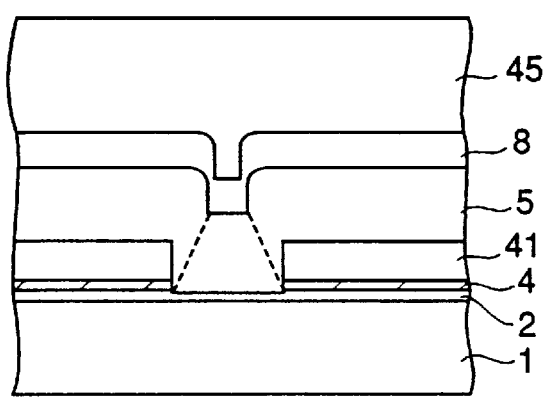
Figure 11:
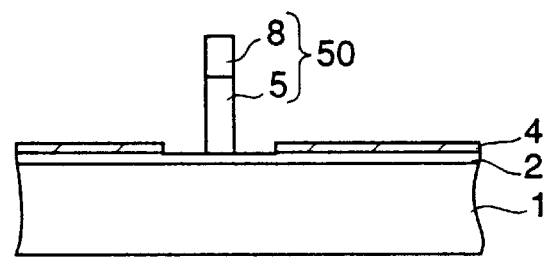
Figure 11:
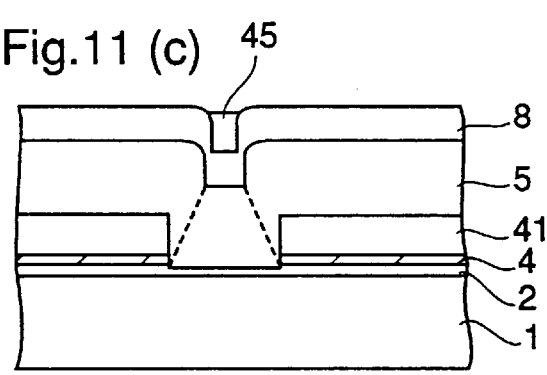
Figure 11:
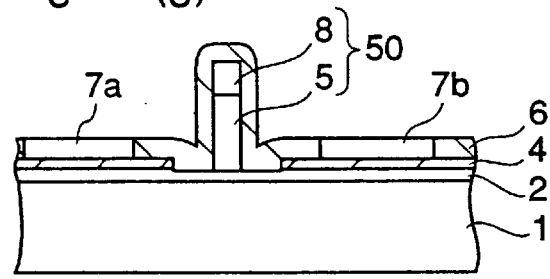
Figure 11:
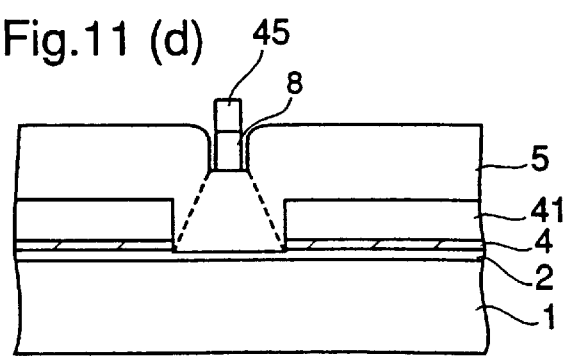

The process steps for fabricating the FET shown in FIG. 10 are illustrated in FIGS. 11(a)–11(g). As in the above-described fourth embodiment, a compound semiconductor substrate 1 having an n layer 2 and an n⁺ layer 4 is used, and a recess is produced in the same process steps as shown in FIGS. 9(a) and 9(b). After the recess etching, the resist 42 is removed, and a refractory metal film 5 is deposited by CVD or sputtering, followed by annealing at about 500° C. to remove damage due to the CVD or sputtering. Then, a low-resistance metal film 8, such as Au, is deposited on the refractory metal film 5 as shown in FIG. 11(a). The refractory metal film 5 deposited on the step parts has porous portions 70 shown by dotted lines in the figure. Thereafter, as shown in FIG. 11(b), a resist 45 is deposited to make the uneven surface, i.e., the hollow part, of the refractory metal film 5 flat.

In the step of FIG. 11(c), the resist 45 is etched back by O₂ ashing, leaving a portion in the hollow part of the refractory metal film 5. Thereafter, using the resist 45 as a mask, the low-resistance metal film 8 comprising Au is etched by ion milling with Ar ions (FIG. 11(d)) and the refractory metal film 5 is etched by plasma etching or ECR etching (FIG. 11(e)), thereby producing a gate electrode 50. As a result of the etching, the porous portions 70 of the refractory metal film 5 are removed.

After removal of the resist 45 and the insulating film 41 (FIG. 11(f)), an insulating film 6 is deposited and source and drain electrodes 7a and 7b are produced, completing an FET shown in FIG. 11(g).

In the above-described method, since the n layer 2 and the n⁺ layer 4 are formed on the substrate 1 in advance, the process steps after the formation of these layers 2 and 4 are carried out at low temperatures. Since the gate electrode 50 includes the low-resistance metal film 8, a high temperature processing, such as annealing for activating ion-implanted layers, cannot be performed after the formation of the gate electrode. When the low-resistance metal film 8 comprises Au and the refractory metal film 5 comprises WSi, Au is diffused into WSi at a temperature exceeding 400° C.

The FET having the Au/WSi gate electrode 50 according to this fifth embodiment of the invention provides an advantage of reducing the gate resistance because the resistivity of Au used as the low-resistance metal film 8 is 2.1 μΩcm while the resistivity of WSi used as the refractory metal film 5 is 100–200 μΩcm. Further, this novel FET has an advantage over the prior art FET shown in FIG. 29 of reducing the gate to source capacitance and the gate to drain capacitance. More specifically, in the prior art FET shown in FIG. 29, the capacitance between the over-hanging portion of the gate electrode and the source electrode (drain electrode) is added to the gate to source capacitance (gate to drain capacitance). Whereas, the FET according to the present invention has no over-hanging portion of the gate electrode. In the prior art FET shown in FIG. 29, assuming that the gate width is 280 μm, the width of the over-hanging portion of the gate electrode is 0.5 μm, the spacing between the over-hanging portion and the surface of the n⁺ layer is 0.2 μm, the capacitance of the over-hanging portion is 0.006 pF. The capacitance of the over-hanging portion is not negligible compared to the gate to source capacitance $C_{gs}$ (about 0.3 pF) and the gate to drain capacitance $C_{gd}$ (about 0.03 pF) of a typical FET, and especially it accounts for a large percentage of the gate to drain capacitance. Furthermore, in contrast to the prior art FET shown in FIG. 29 in which the gate electrode has a V-shaped hollow at the top surface, the porous portions 70 of the refractory metal film 5 are completely etched away during the etching process for forming the gate electrode 50, so that the refractory metal film 5 of the completed gate electrode 50 has no porous portion. As a result, abnormal diffusion of the low-resistance metal into the porous portion of the refractory metal during the operation of the FET is avoided, thereby improving reliability.

Embodiment 6.

Figure 12:
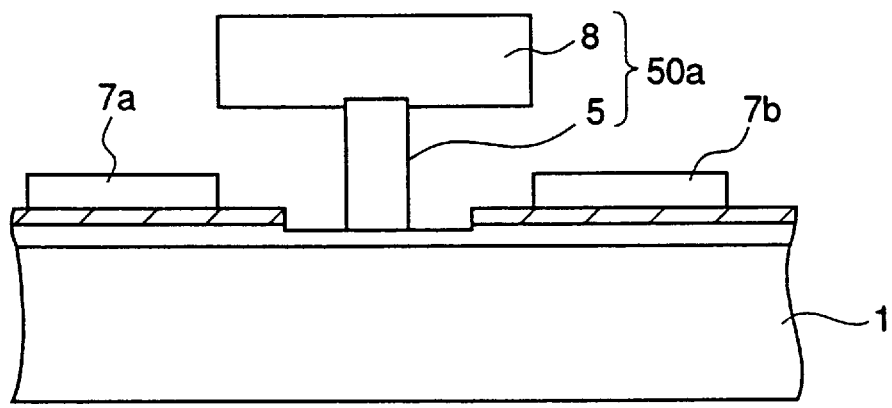
Figure 12:
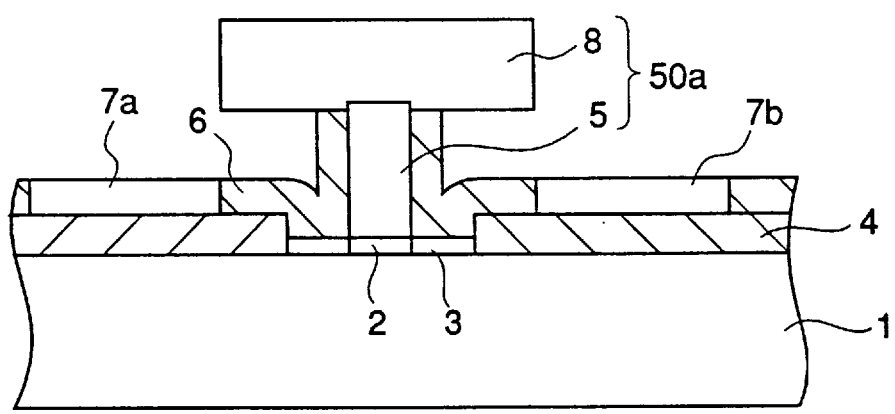

FIG. 12(a) is a sectional view illustrating an FET in accordance with a sixth embodiment of the present invention. While in the above-described fifth embodiment the low-resistance metal gate 8 is formed self-alignedly with the refractory metal gate 5, in this sixth embodiment a low-resistance metal gate 8a wider than the gate length of the refractory metal gate 5 is disposed on the refractory metal gate 5.

Figure 13:
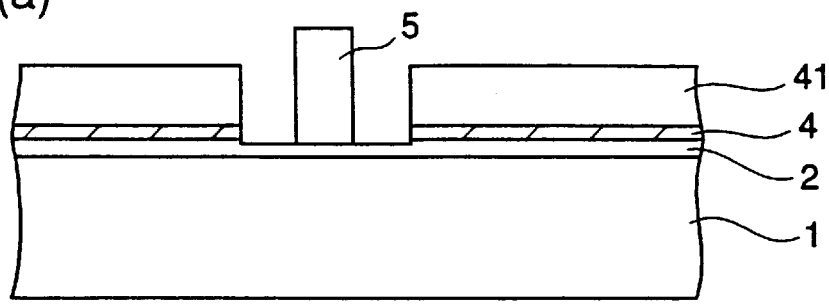
Figure 13:
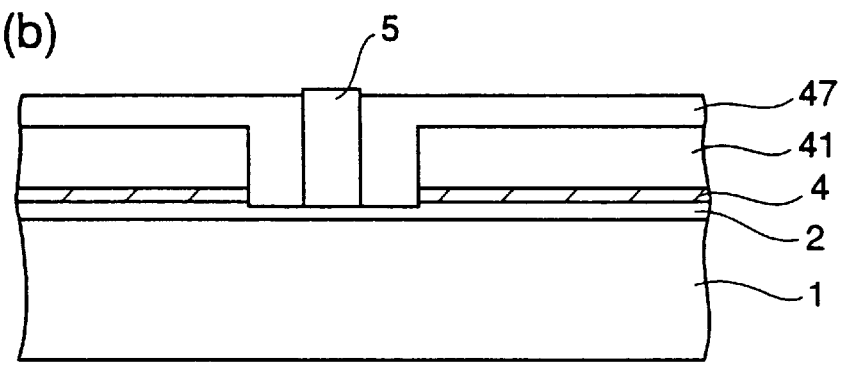
Figure 13:
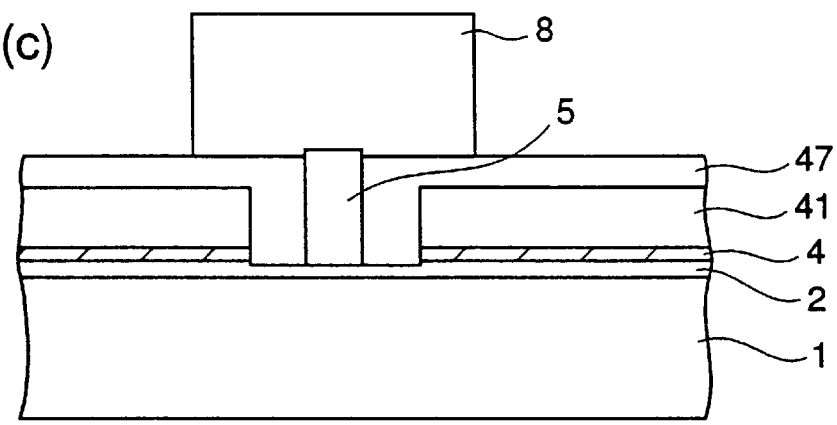
Figure 13:
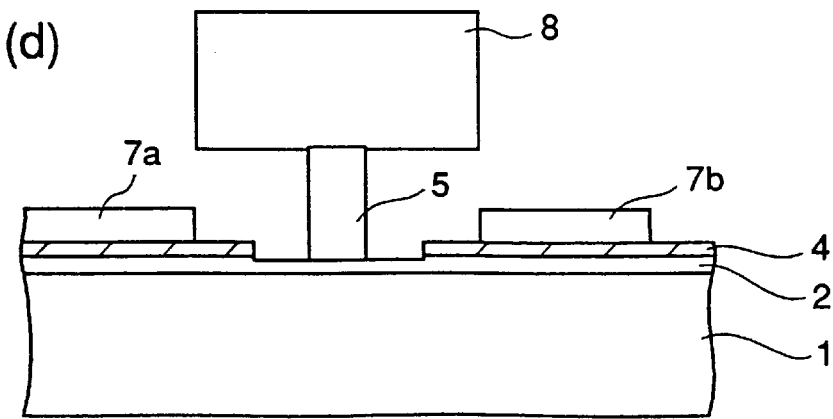

Process steps for fabricating the FET shown in FIG. 12(a) are illustrated in FIGS. 13(a)–13(d). As in the above-described fourth embodiment, a compound semiconductor substrate 1 having an n layer 2 and an n⁺ layer 4 is used, and a recess is produced in the same process steps as shown in FIGS. 9(a) and 9(b). Thereafter, the refractory metal gate 5 is formed in the same manner as described with respect to FIG. 9(c). However, the insulating film 41 is not removed in this sixth embodiment. The structure after the formation of the refractory metal gate is shown in FIG. 13(a).

In the step of FIG. 13(b), a resist 47 is deposited over the structure and etched by O₂ ashing. The etching is stopped when the upper surface of the refractory metal gate 5 is exposed. In place of the resist 47, SOG (Spin on Glass) can be employed with the same effect. In this case, SOG is etched by RIE using a gas mixture of CF₄ and O₂. In case of using the resist 47, it is necessary to reform the resist 47 by deep UV curing in order to prevent unwanted mixing of the resist 47 and a resist for subsequent formation of a lift-off pattern or a resist used as a mask in subsequent ion milling. Thereafter, as illustrated in FIG. 13(c), a low-resistance metal film 8 is deposited over the refractory metal gate 5 and patterned to remove unnecessary portions. The patterning is carried out using the lift-off technique or ion milling. Finally, the resist 47 and the insulating film 41 are removed, and source and drain electrodes 7a and 7b are produced, completing an FET shown in FIG. 43(d). In this method, since the upper surface of the refractory metal gate 5 is easily exposed due to the presence of the insulating film 41, the gate electrode is produced with high stability.

Figure 14:
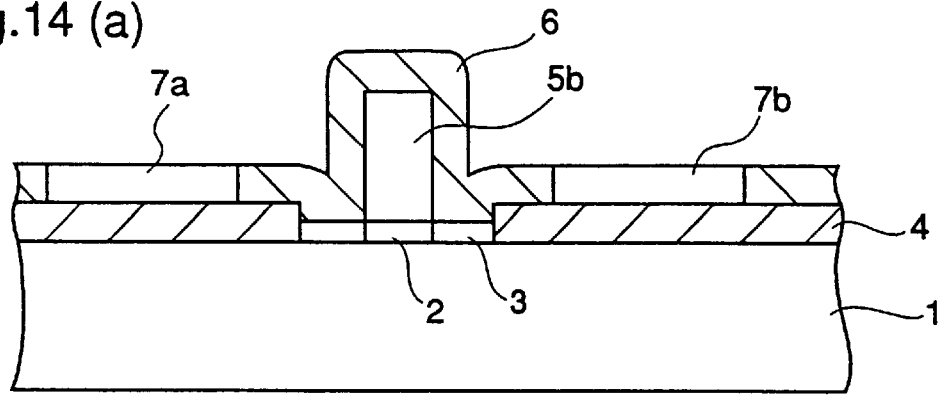
Figure 14:
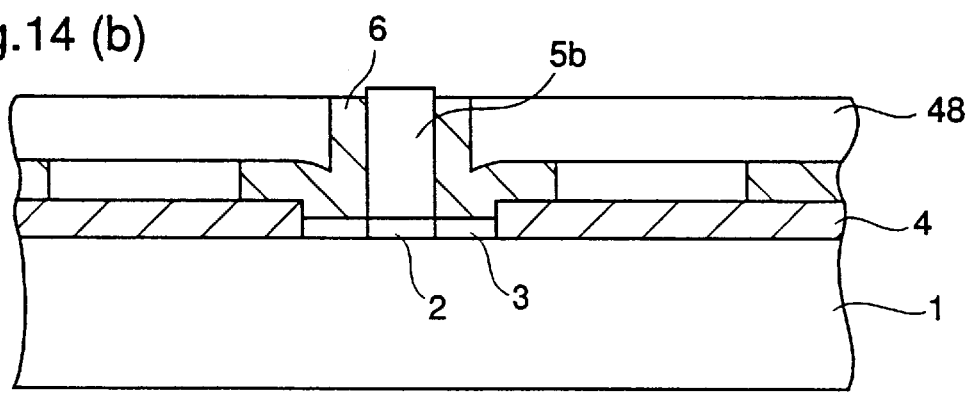
Figure 14:
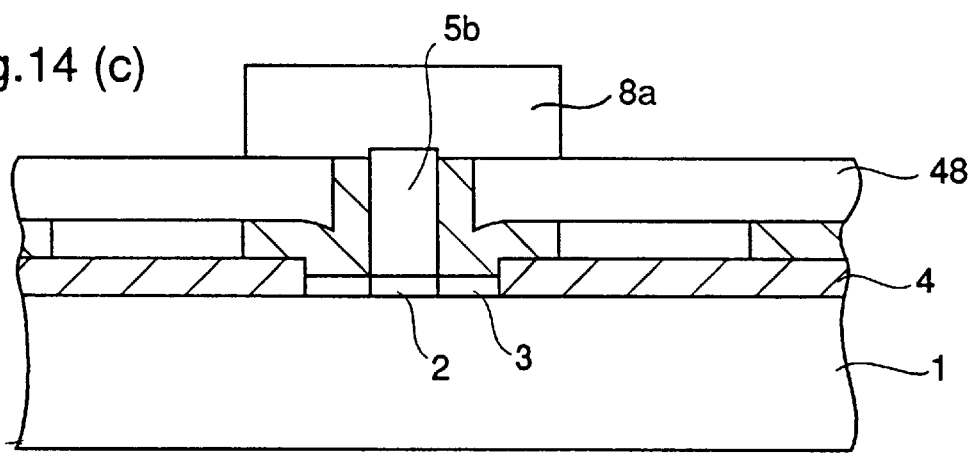
Figure 14:
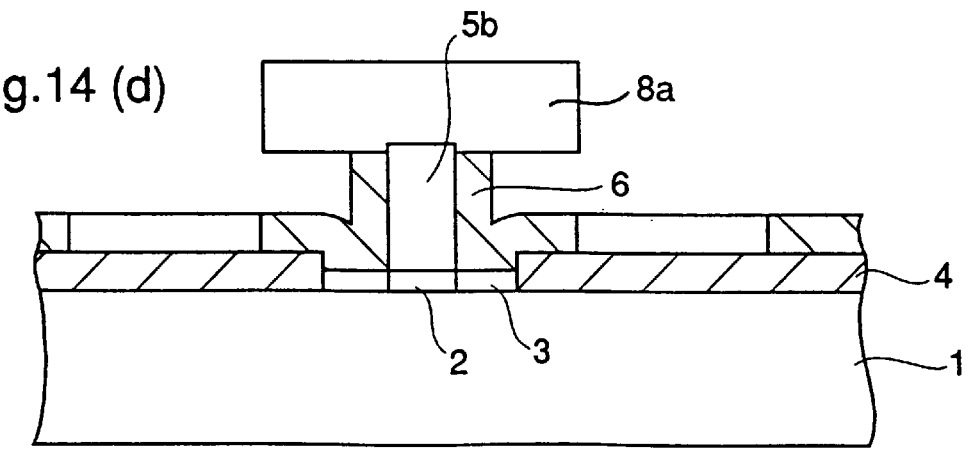

The above-described gate structure comprising the lower refractory metal gate 5 and the upper low-resistance metal gate 8 wider than the gate length of the refractory metal gate 5 can be applied to the FETs according to the first to third embodiments of the invention in which the n layer 2, the n' layers 3, and the n$^+$ layers 4 are produced by ion implantation. FIG. 12(b) is a sectional view illustrating an example of such an FET. The FET shown in FIG. 12(b) is fabricated as follows. Initially, an FET structure shown in FIG. 14(a) is fabricated according to the process steps shown in FIGS. 2(a)–2(p). Thereafter, an insulating film 48 is deposited over the structure by bias CVD to make the surface flat, and the insulating film 48 is etched back until the upper surface of the refractory metal gate 5b is exposed as shown in FIG. 14(b). In place of the insulating film 48, a thick resist film may be employed. Then, a low resistance metal film 8 is deposited and patterned as shown in FIG. 14(c). Finally, the insulating film 48 is removed to complete the FET shown in FIG. 14(d).

The FET according to this sixth embodiment has an advantage over the FET according to the fifth embodiment of reducing the gate resistance. For example, a gate electrode comprising a single WSi layer (resistivity: 100 $\mu\Omega$cm) and having a gate length of 0.5 $\mu$m, a gate width of 280 $\mu$m, and a gate height of 0.5 $\mu$m provides a gate resistance of 1120 $\Omega$. A gate electrode comprising the above-described WSi layer and an Au layer (resistivity: 2.1 $\mu\Omega$cm) disposed on the WSi layer and having a width of 0.5 $\mu$m, a length of 280 $\mu$m, and a height of 0.5 $\mu$m provides a gate resistance of 94 $\Omega$. A gate electrode comprising the above-described WSi layer and an Au layer having a width of 3 $\mu$m, a length of 280 $\mu$m, and a height of 1 $\mu$m provides a gate resistance is 2 $\Omega$. That is, the gate structure according to this sixth embodiment provides the lowest gate resistance. The reduction in the gate resistance contributes to an improvement of characteristics of the FET when it is operated in high frequency band.

Embodiment 7.

Figure 15:
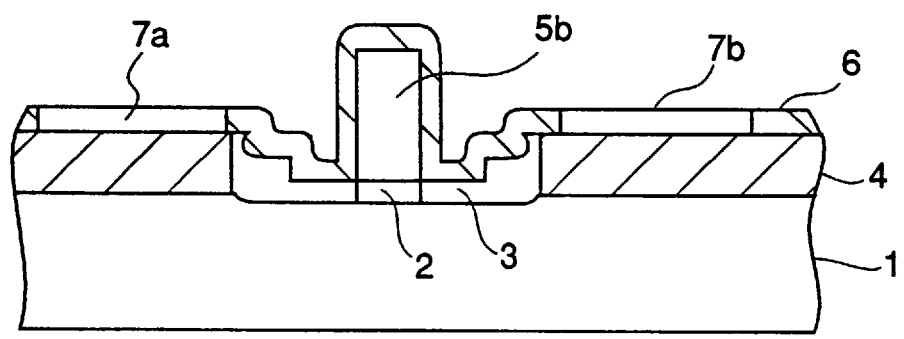

FIG. 15 is a sectional view illustrating an FET in accordance with a seventh embodiment of the present invention. While in the foregoing description the FET includes a single-stage recess, the structure of the recess is not restricted thereto. In this seventh embodiment, an FET having a double-stage recess will be described.

Figure 16:
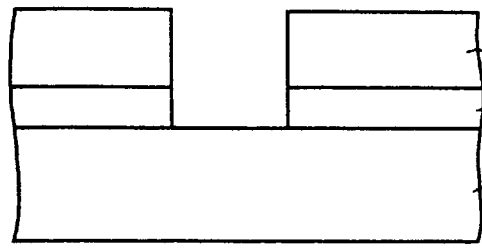
Figure 16:
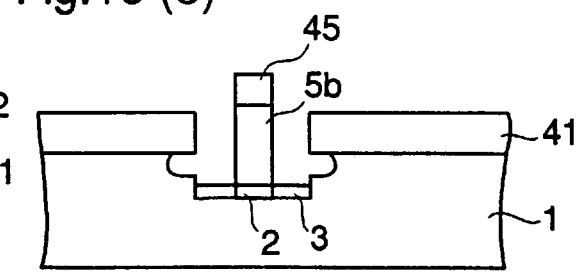
Figure 16:
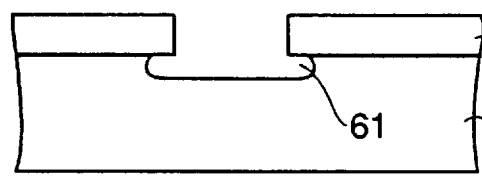
Figure 16:
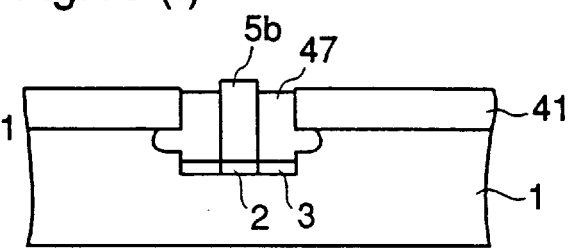
Figure 16:
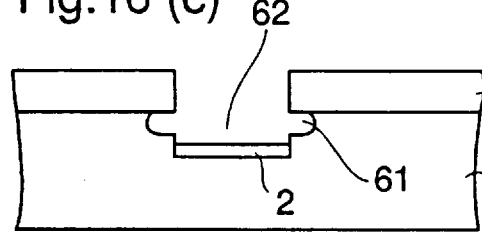
Figure 16:
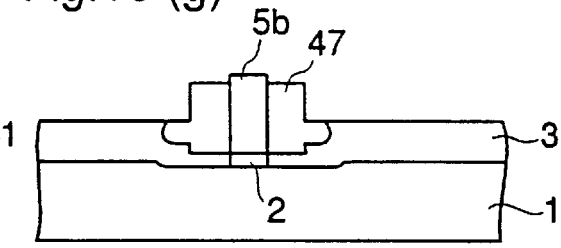
Figure 16:
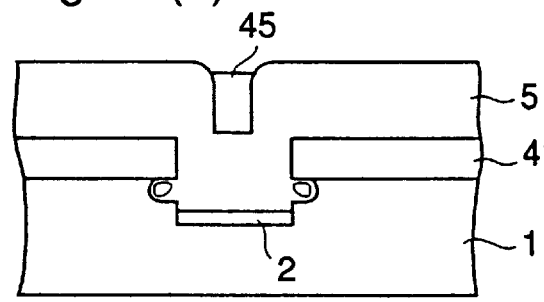
Figure 16:
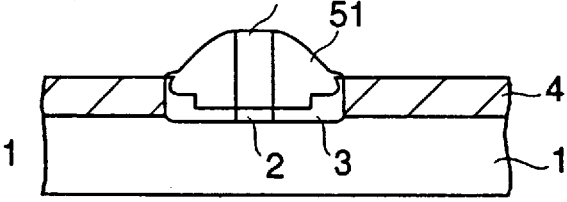
Figure 16:
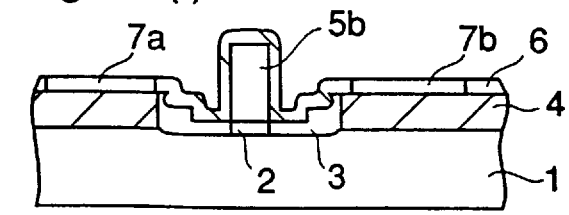

The process steps for fabricating the FET shown in FIG. 15 are illustrated in FIGS. 16(a)–16(i). Initially, as illustrated in FIG. 16(a), an insulating film 41 is deposited on a compound semiconductor substrate 1, and a resist film 42 having a desired opening pattern is formed on the insulating film 41, followed by etching of the insulating film 41 using the resist film 42 as a mask. After removal of the resist film 42, using the insulating film 41 as a mask, the compound semiconductor substrate 1 is etched by an isotropic etching, such as wet etching, forming a first recess 61 as shown in FIG. 16(b).

In the step of FIG. 16(c), using the insulating film 41 as a mask, the compound semiconductor substrate 1 is etched by anisotropic etching to form a second recess 62 within the first recess 61, thereby completing a double-stage recess structure. If a recess with more than two stages is desired, the isotropic etching and the anisotropic etching are repeated. Thereafter, Si ions are implanted into the substrate 1 from the bottom of the second recess 62 to produce an n layer 2.

In the step of FIG. 16(d), a refractory metal film 5 is deposited, and a first resist 45 is applied and patterned by etching, leaving a portion in the hollow part of the refractory metal film 5. Thereafter, as illustrated in FIG. 16(e), the refractory metal film 5 is etched using the resist 45 as a mask, forming a gate electrode 5b. Then, n' layers 3 are formed in the second recess 62 by ion implantation.

After removal of the first resist 45, a second resist 47 is applied and etched to leave a portion within the opening of the recess as shown in FIG. 16(f). After removal of the insulating film 41, Si ions are implanted to form n' layers under the first recess 61 and at the surface of the compound semiconductor substrate 1, as illustrated in FIG. 16(g). The accelerating energy of the ion implantation should be selected so that the bottoms of the n' layers 3 under the first and second recesses 61 and 62 are at the same level. When the compound semiconductor substrate 1 is isotropically etched, portions of the substrate 1 are etched over the edge of the opening of the insulating film 41, forming spaces under the insulating film 41 as shown in FIG. 16(b). When the resist 47 is applied in the step of FIG. 16(f), the resist enters into those spaces under the insulating film 41, whereby the implantation profile is varied a little. More specifically, since the stopping power of resist to ions is smaller than that of a compound semiconductor, when Si ions are implanted so that the bottoms of the n' layers under the first recess 61 and the second recess 62 are at the same level, the n' layers outside the recess become shallower than the n' layers under the recess, as shown in FIG. 16(g). In addition, in the step of FIG. 16(g), since the dose of the ions is selected so that the dopant concentration of the n' layers under the first recess 61 is equal to the dopant concentration of the n' layers under the second recess 62, the boundary between these n' layers disappears.

In the step of FIG. 16(h), after removal of the resist 47, an insulating film 51 is deposited on the both sides of the refractory metal gate 5b in the same process as described in the third embodiment of the invention. Further, using the insulating film 51 as a mask, Si ions are implanted to form n$^+$ layers 4, followed by removal of the insulating film 51. Finally, an insulating film 6 is deposited, and source and drain electrodes 7a and 7b are produced, completing an FET as shown in FIG. 16(i). Although the n layer 2, the n' layers 3, and the n$^+$ layers 4 are formed in different steps, the n$^+$ layers 4 can be formed simultaneously with the n' layers 3 in the step of FIG. 16(g) by increasing the dose of implanted ions. In this case, the step of FIG. 16(h) is dispensed with.

Figure 24:
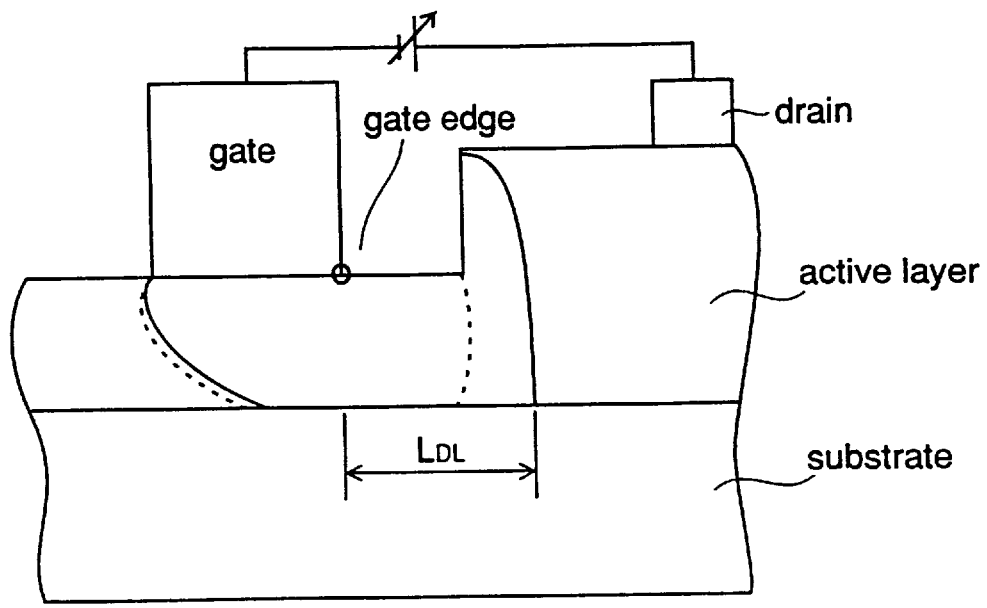
FIG. 24(a) is a schematic diagram illustrating an extension of a charge depletion layer in an active layer of a single-stage recess FET and FIG. 24(b) is a schematic diagram illustrating an extension of a charge depletion layer in an active layer of a double-stage recess FET.
Figure 24:
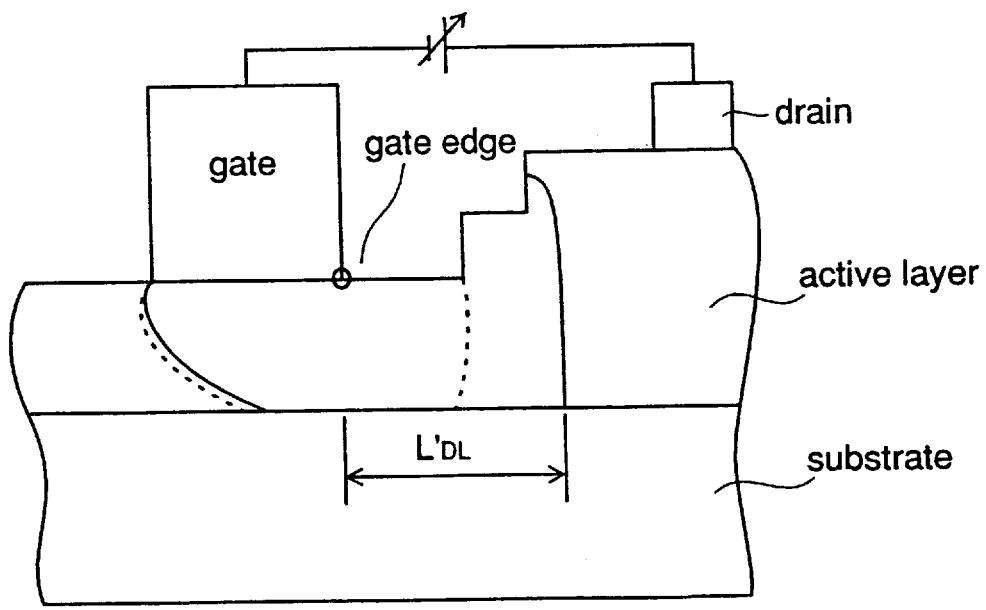

The double-stage recess FET shown in FIG. 15 is fabricated through the above-described process steps. Usually an FET having a multiple-stage recess provides a lower gate breakdown voltage $V_{BGD}$ than an FET having a single-stage recess. In a single-stage recess FET shown in FIG. 24(a), when the drain voltage is increased, the reverse voltage to the gate-to-drain Schottky contact is increased, and the depletion layer extends in the horizontal direction until reaching the edge of the recess. After the depletion layer reaches the recess edge, the extension in the horizontal direction is suppressed because the thickness of the channel layer suddenly increases. As a result, the electric field at the gate edge suddenly increases when the depletion layer reaches the recess edge. On the other hand, in a double-stage recess FET shown in FIG. 24(b), since the thickness of the channel layer does not increase suddenly but increases stepwise, the extension of the depletion layer in the horizontal direction is not suppressed. As a result, an increase in the electric field at the gate edge is suppressed, thereby increasing the gate breakdown voltage.

In the FET according to this seventh embodiment, since the n$^+$ layers 4 are arranged as shown in FIG. 15, the width of the second recess 62 is narrower than the width of recess of the single-stage recess FET, whereby the gate to drain resistance is reduced. The double-stage recess structure shown in FIG. 15 may be applied to the FET shown in FIG. 8 in which the n/n' laminated structure is produced by epitaxial growth.

Embodiment 8.

Figure 17:
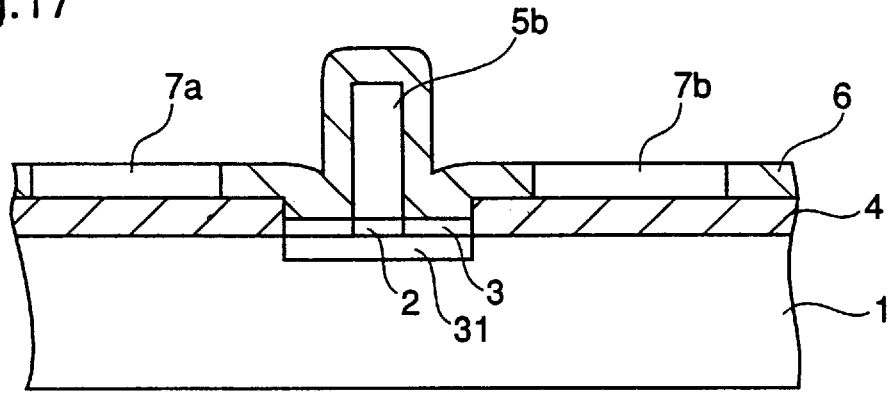

FIG. 17 is a sectional view illustrating an FET in accordance with an eighth embodiment of the invention. In the FET shown in FIG. 17, a buried p layer 31 is disposed under the n layer 2 and the n' layers 3. On the other hand, in the prior art BPLDD-FET disclosed by M. Noda et al in IEEE Transactions on Electron Devices, Vol. 39 (1992), p. 757, the buried p layer is located under the n, n', and $n^+$ layers or surrounding these layers. The function of the buried p layer in the FET is to suppress the short channel effect when the gate length is shorter than 1.0 $\mu$m.

Figure 18:
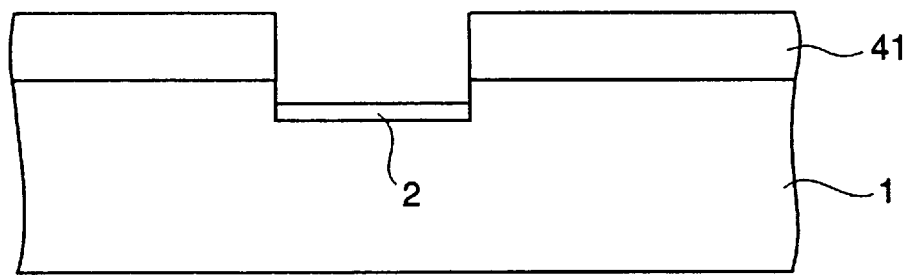
Figure 18:
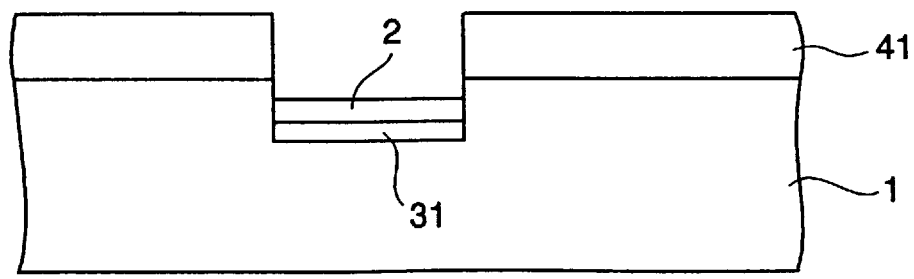

A description is given of the fabricating process of the FET shown in FIG. 17. Initially, a recess is formed in the compound semiconductor substrate 1 in the process steps already described with respect to FIGS. 2(a)–2(c) and, thereafter, an n' layer 2 is formed at the bottom of the recess as shown in FIG. 18(a). Then, p type dopant ions, such as Mg ions, are implanted through the n layer 2 at an accelerating energy of 300 keV and a dose of about $1.5 \times 10^{12}$ cm$^{-2}$, forming a p layer 31 under the n layer 2 as shown in FIG. 18(b). After a gate electrode is produced in the recess, portions of the n layer 2 other than a portion just under the gate electrode are changed into n' type by ion implantation. The process steps after the formation of the p layer 31 are identical to those already described with respect to FIGS. 2(e)–2(p).

In the fabricating method according to the present invention the buried p layer is self-alignedly produced under the n and n' layers. The process step of making the buried p layer may be applied to the fabricating methods according to the second, third, and seventh embodiments of the invention.

In the prior art FET shown in FIG. 25(a), when the gate length is reduced, leakage current flows between the n' and $n^+$ layers on the source side and the n' and $n^+$ layers on the drain side through the interface of the n layer 2 and the substrate 1, and this leakage current makes control of drain current in response to gate voltage difficult. This phenomenon is called the short channel effect. When a buried p layer 31 is produced under the n, n', and $n^+$ active layers 2, 3, and 4 as shown in FIG. 25(b), a p-n junction is made between the p layer and these active layers, and the p-n junction suppresses the unwanted leakage current. Although the p layer under the n and n' layers 2 and 3 has the effect of suppressing the short channel effect, the p layer under the $n^+$ layer 4 is useless for this purpose. On the contrary, the contact capacitance between the p layer and the $n^+$ layer reduces the operating speed of the FET. As is well known, among n-layer/p-layer, n'-layer/p-layer, and $n^+$-layer/p-layer contact, the $n^+$-layer/p-layer contact has the largest contact capacitance. Therefore, in the FET according to this eighth embodiment shown in FIG. 17, the buried p layer 31 is not present under the $n^+$ layers 4 but only under the n layer 2 and the n' layers 3 self-aligned with these layers, whereby reduced short channel effect and increased operating speed are realized simultaneously. However, a buried p layer has the above-described effect only in an FET having a gate length shorter than 1.0 $\mu$m. In an FET having a gate length exceeding 1.0 $\mu$m, the buried p layer has no effect, and a structure with no buried p layer as described in the first embodiment of the invention surpasses the structure with the buried p layer in operating speed.

Embodiment 9.

While in the above-described first to eighth embodiments emphasis has been placed upon methods for self-alignedly producing a recess, a gate electrode, and active layers and semiconductor devices, specifically FETs, fabricated by the methods, the self-aligning process according to the present invention can be applied to a fabrication of a mesa structure.

FIGS. 19(a)–19(k) are sectional views illustrating process steps in a method of fabricating an HBT (Heterojunction Bipolar Transistor) in accordance with a ninth embodiment of the present invention.

Figure 19:
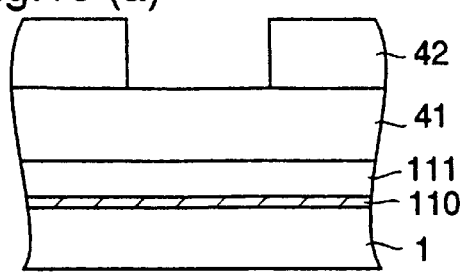
Figure 19:
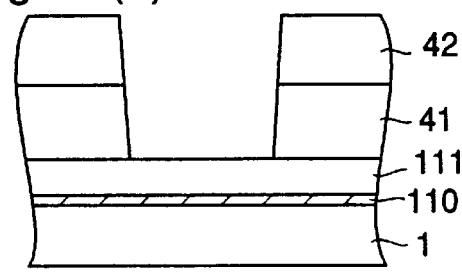
Figure 19:
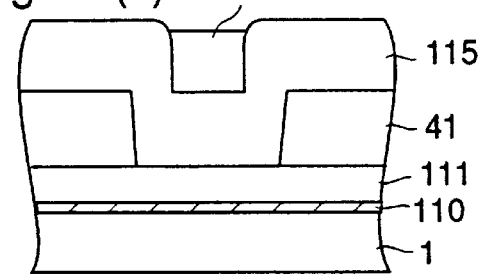
Figure 19:
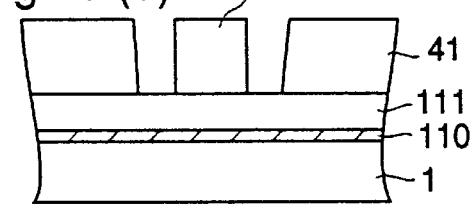
Figure 19:
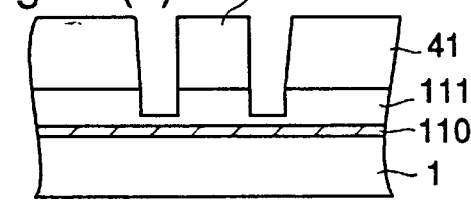
Figure 19:
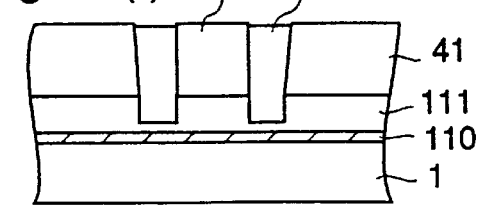
Figure 19:
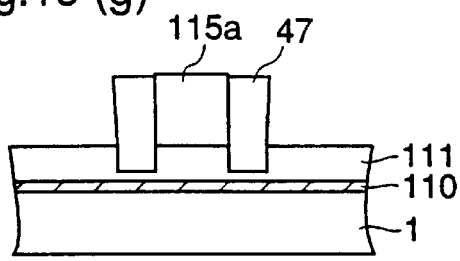
Figure 19:
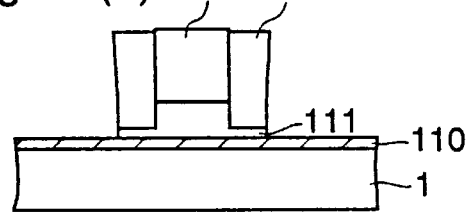
Figure 19:
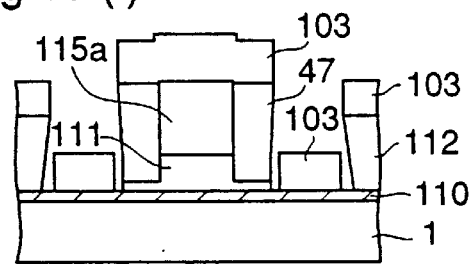
Figure 19:
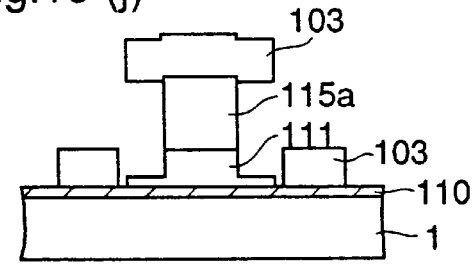
Figure 19:
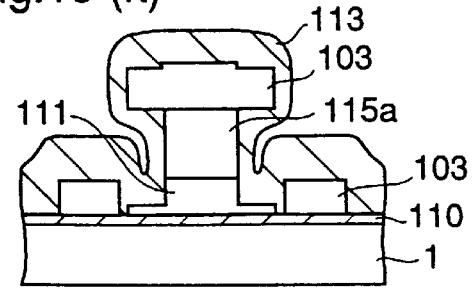

Initially, a base layer 110 and an emitter layer 111 are epitaxially grown on a compound semiconductor substrate 1. Thereafter, as illustrated in FIG. 19(a), an insulating film 41 is deposited on the emitter layer 111, and a resist film 42 having an opening pattern is formed on the insulating film 41. Using the resist film 42 as a mask, the insulating film 41 is taper-etched as shown in FIG. 19(b). When the insulating film 41 comprises $SiO_2$, it is etched by RIE with a gas mixture of $CHF_3$ and $O_2$. The taper-etching is achieved by increasing the flow ratio of $O_2$ and utilizing the retrogression of the resist 42. When SiON is used for the insulating film 41, taper-etching is achieved, simultaneously with side-etching of the insulating film 41, by plasma etching with $SF_6$ or a mixture of $CF_4$ and $O_2$.

After removal of the resist 42, a refractory metal film 115 is deposited, and a resist 45 is filled in a hollow part of the refractory metal film 115, as shown in FIG. 19(c). In this ninth embodiment, the difference in level, i.e., the height of steps, at the surface of the substrate depends on the thickness of the insulating film 41 whereas it depends on the thickness of the insulating film and the depth of the recess in the above-described first embodiment. Therefore, in the step of FIG. 19(a), the insulating film 41 should be deposited a little thicker than in the first embodiment, i.e., about 400 nm. Furthermore, the step coverage of the refractory metal film 115 is improved because of the tapered opening of the insulating film 41. Therefore, when the angle of tapering is 800, 400 nm is sufficient for the thickness of the refractory metal film 115 whereas 600 nm or more is required in the first embodiment. The 400 nm thick refractory metal film 115 provides a spacing of 0.16 $\mu$m between the insulating film 41 and a refractory metal emitter electrode 115a which is later produced.

In the step of FIG. 19(d), using the resist 45 as a mask, the refractory metal film 115 is etched to form a refractory metal emitter electrode 115, followed by removal of the resist 45. Then, as illustrated in FIG. 19(e), the emitter layer 111 is etched to the middle of that layer, forming a mesa-shaped emitter structure. Although the resist 45 is removed in the step of FIG. 19(d), it may be removed after the formation of the mesa structure. Thereafter, as illustrated in FIG. 19(f), grooves on both sides of the mesa structure are filled with a resist 47.

After removal of the insulating film 41 by etching (FIG. 19(g)), the emitter layer 111 is etched until the surface of the base layer 110 is exposed (FIG. 19(h)). Thereafter, a base metal 103 is deposited by vacuum evaporation as shown in FIG. 19(i). Prior to the deposition of the base metal 103, the resist 47 is subjected to deep UV curing, and a resist pattern 112 for base electrodes is formed. The deep UV curing of the resist 47 is for reforming the resist 47 so that it is not deformed when the resist pattern 112 is produced. After the deposition of the base metal, unnecessary portions of the base metal on the mesa structure and on the resist films 47 and 112 are removed in a lift-off process, resulting in the structure shown in FIG. 19(j). Finally, as illustrated in FIG. 19(k), passivation is achieved by forming an insulating film 113 over the structure. To complete an HBT, a resist (not shown) is patterned using a photolithographic technique, and portions of the insulating film 113 and the base layer 110 are etched with the resist pattern as a mask, followed by deposition of collector electrodes (not shown).

Since the above-described method does not include the etchback process using RIE for making the $SiO_2$ side walls which is employed in the prior art method, the substrate is not damaged or etched due to the etchback process. In addition, since the diagonal ion milling for removing the base metal is dispensed with, degradation of device characteristics is reduced. Furthermore, since the mesa-shaped emitter structure is formed self-alignedly with the refractory metal emitter electrode, variations in the device characteristics are reduced.

What is claimed is:

1. A method of fabricating a semiconductor device including:
   preparing a single compound semiconductor substrate having a surface;
   forming an insulating film on the surface of the compound semiconductor substrate and patterning the insulating film to form an opening;
   using the insulating film as a mask, forming a recess in the compound semiconductor substrate;
   using the insulating film as a mask, implanting dopant ions producing a first conductivity type in the compound semiconductor substrate at the bottom of the recess, forming a channel region having a dopant concentration;
   depositing a refractory metal film on the insulating film and on the compound semiconductor substrate through the opening in the insulating film;
   applying a first resist over the refractory metal film and etching back the first resist, leaving a portion of the first resist on a part of the refractory metal film, opposite the opening in the insulating film;
   using the portion of the first resist left on the refractory metal film as a mask, etching the refractory metal film to form a refractory metal gate electrode;
   using the insulating film and the gate electrode as masks, implanting dopant ions producing the first conductivity type in the compound semiconductor substrate to form intermediate dopant concentration regions having a dopant concentration higher than the dopant concentration of the channel region;
   applying a second resist over the structure, filling the opening in the insulating film, and etching back the second resist to leave a portion of the second resist within the opening in the insulating film at sides of the gate electrode;
   removing the insulating film;
   using the gate electrode and the portion of the second resist left at sides of the gate electrode as masks, implanting dopant ions producing the first conductivity type in the compound semiconductor substrate to form high dopant concentration regions having a dopant concentration higher than the dopant concentration of the intermediate dopant concentration region;
   removing the second resist;
   annealing the compound semiconductor substrate to activate the implanted dopant ions;
   disposing a passivating insulating film on the compound semiconductor substrate and on the gate electrode; and
   producing spaced apart source and drain electrodes on the semiconductor substrate, followed by sintering.

2. The method of claim 1 including depositing the refractory metal film by sputtering.

3. The method of claim 1 including depositing the refractory metal film by chemical vapor deposition.

4. The method for fabricating a semiconductor device as defined in claim 1 including:
   after removing the second resist and before annealing, depositing a second insulating film over the compound semiconductor substrate and the gate electrode;
   etching back the second insulating film to form side walls comprising portions of the second insulating film on both sides of the gate electrode so that each side wall has a width smaller than the distance from a side wall of the gate electrode to the edge of the recess;
   using the side walls and the gate electrode as masks, implanting dopant ions producing the first conductivity type in unmasked regions of the compound semiconductor substrate at the recess to form, within parts of the recess, second high dopant concentration regions having a dopant concentration higher than the dopant concentration of the intermediate dopant concentration regions within the recess; and
   removing the side walls.

5. The method of claim 1 wherein first intermediate dopant concentration regions having a dopant concentration higher than the dopant concentration of the channel region are formed in implanting dopant ions using the insulating film and the gate electrode as masks, and in using the gate electrode and the second resist as ion implantation masks and implanting dopant ions, forming second intermediate dopant concentration regions having a dopant concentration equivalent to the dopant concentration of the first intermediate dopant concentration regions including:
   after removing the second resist, depositing a second insulating film on the compound semiconductor substrate and on the gate electrode;
   etching back the second insulating film to form side walls comprising the second insulating film on both sides of the gate electrode so that each side wall has a width larger than the distance from a side wall of the gate electrode to the edge of the recess;
   using the side walls of the second insulating film and the gate electrode as masks, implanting dopant ions producing the first conductivity type in the compound semiconductor substrate to form second high dopant concentration regions having a dopant concentration higher than the dopant concentrations of the first and second intermediate dopant concentration regions.

6. The method of claim 1 including:
   after formation of the source and drain electrodes and sintering, depositing a coating film on the insulating film for passivation and on the source and drain electrodes;
   etching back the coating film until the surface of the coating film is at the same level as the top surface of the refractory metal gate electrode to expose the top surface of the refractory metal gate electrode; and
   forming a low-resistance metal film on the top surface of the refractory metal gate electrode and on part of the coating film.

7. The method of claim 1 including:
   after formation of the recess and before deposition of the refractory metal film, using the insulating film as a mask, implanting dopant ions producing a second conductivity type, opposite the first conductivity type, into the compound semiconductor substrate to form a second conductivity type region beneath the first conductivity type channel region.

* * * * *